(12) United States Patent
Kim et al.

(10) Patent No.: US 12,016,223 B2
(45) Date of Patent: Jun. 18, 2024

(54) DISPLAY DEVICE WITH DRIVING IC HAVING OUTPUT PADS WITH DIFFERENT HEIGHTS

(71) Applicant: Samsung Display Co., LTD., Yongin-si (KR)

(72) Inventors: Hongam Kim, Seoul (KR); Youngmin Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 410 days.

(21) Appl. No.: 17/352,991

(22) Filed: Jun. 21, 2021

(65) Prior Publication Data

US 2022/0137682 A1    May 5, 2022

(30) Foreign Application Priority Data

Nov. 5, 2020    (KR) .................. 10-2020-0146918

(51) Int. Cl.
  *H10K 59/131*    (2023.01)
  *G09F 9/30*    (2006.01)

(52) U.S. Cl.
  CPC ........... *H10K 59/131* (2023.02); *G09F 9/301* (2013.01)

(58) Field of Classification Search
  CPC .............................. H10K 59/131; G09F 9/301
  See application file for complete search history.

(56) References Cited

U.S. PATENT DOCUMENTS

| | | |
|---|---|---|
| 2017/0257939 A1 | 9/2017 | Sano et al. |
| 2019/0326274 A1 | 10/2019 | Lee et al. |
| 2019/0348487 A1 | 11/2019 | Kim et al. |
| 2020/0077518 A1* | 3/2020 | Kim .................... G02F 1/13458 |
| 2020/0127242 A1 | 4/2020 | Yang et al. |

FOREIGN PATENT DOCUMENTS

| | | |
|---|---|---|
| JP | 2004-71857 | 3/2004 |
| KR | 10-2016-0091526 | 8/2016 |

OTHER PUBLICATIONS

Extended European search report for European Patent Application or Patent No. 21196447.3 dated Feb. 23, 2022.

* cited by examiner

*Primary Examiner* — Lex H Malsawma
(74) *Attorney, Agent, or Firm* — KILE PARK REED & HOUTTEMAN PLLC

(57) ABSTRACT

A display device includes a substrate including a display area and a pad area, a display structure disposed in the display area on the substrate, and a driving integrated circuit disposed in the pad area on the substrate and including a circuit part including an input area, a first output area adjacent to the display area, and a second output area between the input area and the first output area, upper output bumps disposed in the first output area on a bottom surface of the circuit part, and lower output bumps disposed in the second output area on the bottom surface of the circuit part. First output pads are disposed between the substrate and the upper output bumps, and have a first height. Second output pads are disposed between the substrate and the lower output bumps, and have a second height smaller than the first height.

21 Claims, 17 Drawing Sheets

FIG. 2
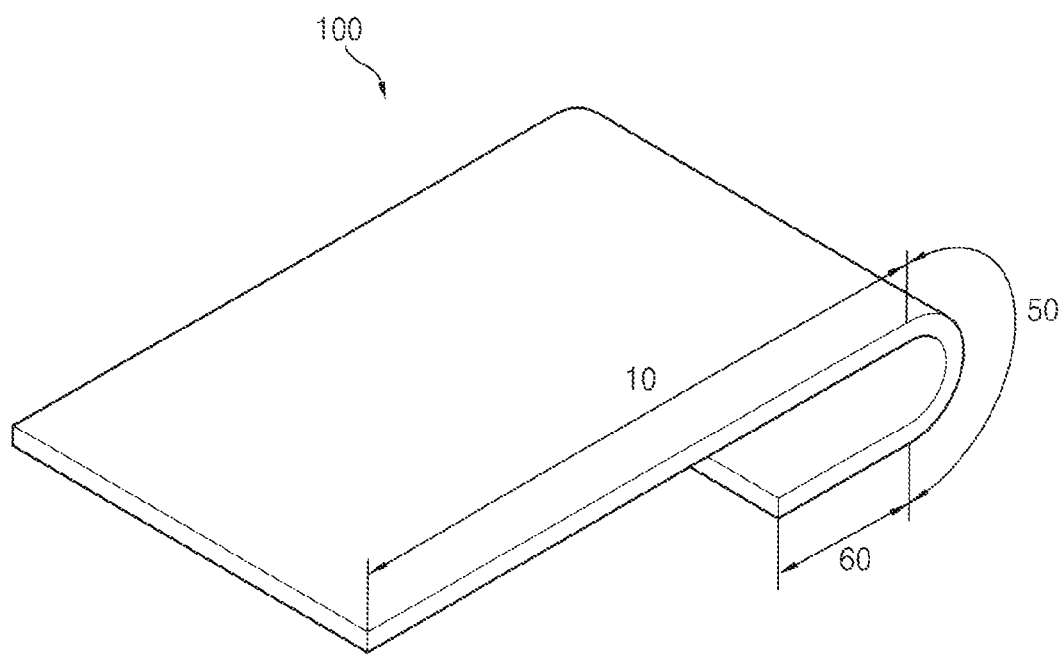
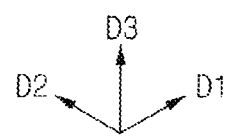

DISPLAY DEVICE WITH DRIVING IC HAVING OUTPUT PADS WITH DIFFERENT HEIGHTS

CROSS-REFERENCE TO RELATED APPLICATION(S)

This application claims priority to and benefits of Korean Patent Application No. 10-2020-0146918 under 35 USC § 119, filed on Nov. 5, 2020 in the Korean Intellectual Property Office (KIPO), the entire disclosure of which is incorporated herein by reference.

BACKGROUND

1. Technical Field

Embodiments relate to a display device including a driving integrated circuit.

2. Description of the Related Art

Flat panel display devices are used as display devices, are lightweight and thin, and have generally replaced bulkier and heavier cathode ray tube display devices. As representative examples of such flat panel display devices, there are liquid crystal display devices and organic light emitting diode display devices.

A display device may include a substrate, and the substrate may be divided into a display area and a pad area. A display structure may be disposed in the display area on the substrate, and an image may be displayed through the display structure. A driving integrated circuit, signal pads, and the like may be disposed in the pad area on the substrate, and after image signals are provided from an external device capable of generating the image signals to the driving integrated circuit through the signal pads, the image signals provided to the driving integrated circuit may be provided to the display structure. In order to protect a bottom surface of the substrate, the display device may further include a lower protective film and an adhesive layer configured to bond the substrate to the lower protective film. For example, each of the adhesive layer and the lower protective film may have a low (e.g., relatively) Young's modulus.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment may provide a display device including a driving integrated circuit.

According to an embodiment, a display device may include a substrate, a display structure, a driving integrated circuit, first output pads, and second output pads. The substrate may include a display area and a pad area. The display structure may be disposed in the display area on the substrate. The driving integrated circuit may be disposed in the pad area on the substrate, and include a circuit part, upper output bumps, and lower output bumps. The circuit part may include an input area, a first output area adjacent to the display area, and a second output area disposed between the input area and the first output area. The upper output bumps may be disposed in the first output area on a bottom surface of the circuit part. The lower output bumps may be disposed in the second output area on the bottom surface of the circuit part. The first output pads may be disposed between the substrate and the upper output bumps, and have a first height. The second output pads may be disposed between the substrate and the lower output bumps, and have a second height that may be smaller than the first height.

In embodiments, the display device may further include a conductive film disposed between the driving integrated circuit and the substrate.

In embodiments, the conductive film may include a film layer, first conductive balls, and second conductive balls. The first conductive balls may be disposed inside the film layer, overlap the second output area, and may have a first diameter. The second conductive balls may be disposed inside the film layer, overlap the first output area, and may have a second diameter that may be greater than the first diameter.

In embodiments, at least one of the first conductive balls may electrically connect at least one of the first output pads to at least one first output bump of the first output bumps, the at least one of the first output bumps overlapping the at least one of the first output pads, and at least one of the second conductive balls may electrically connect at least one of the second output pads to at least one of the second output bumps, the at least one of the second output bumps overlapping the at least one of the second output pads.

In embodiments, the display device may further include a lower protective film disposed on a bottom surface of the substrate, and an adhesive layer disposed between the substrate and the lower protective film.

In embodiments, each of the lower protective film and the adhesive layer may include a first portion a portion where the driving integrated circuit may not be disposed; a second portion where the driving integrated circuit may be disposed, and a thickness of the first portion may be greater than a thickness of the second portion.

In embodiments, the driving integrated circuit may further include input bumps disposed in the input area on the bottom surface of the circuit part.

In embodiments, the input area may be spaced apart from the second output area in a first direction, and the input bumps may be arranged in a second direction and spaced apart from each other, the first direction and the second direction being orthogonal to each other.

In embodiments, in a plan view of the display device, an area of each of the first output bumps and the second output bumps may be smaller than an area of each of the input bumps.

In embodiments, the input bumps may include a reference input bump, a first input bump, and a second input bump. The reference input bump may extend in a first direction. The first input bump may be spaced apart from a first side of the reference input bump, and may be inclined at a first angle with respect to the first direction. The second input bump may be spaced apart from a second side of the reference input bump, and may be symmetrical to the first input bump with respect to the reference input bump.

In embodiments, the display device may further include input pads disposed between the substrate and the input bump, and having the second height.

In embodiments, in a plan view of the display device, a width of the first output area and the second output area in a first direction may be greater than a width of the input area in the first direction.

In embodiments, the upper output bumps may include a reference upper output bump, a first upper output bump, and a second upper output bump. The reference upper output bump may extend in a first direction. The first upper output bump may be spaced apart from a first side of the reference upper output bump, and may be inclined at a first angle with respect to the first direction. The second upper output bump may be spaced apart from a second side of the reference upper output bump, and may be symmetrical to the first upper output bump with respect to the reference upper output bump.

In embodiments, the lower output bumps may include a reference lower output bump, a first lower output bump, and a second lower output bump. The reference lower output bump may be spaced apart from the reference upper output bump in the first direction, and may extend in the first direction. The first lower output bump may be spaced apart from the first upper output bump in the first direction, and may be inclined at the first angle. The second lower output bump may be spaced apart from the second upper output bump in the first direction, and may be symmetrical to the first lower output bump with respect to the reference lower output bump.

In embodiments, the reference upper output bump, the first upper output bump, and the second upper output bump may be arranged in a second direction that may be orthogonal to the first direction. The reference lower output bump, the first lower output bump, and the second lower output bump may be arranged in the second direction.

In embodiments, the display device may further include signal pads disposed in the pad area on the substrate, and spaced apart from the driving integrated circuit in a first direction. The signal pads may be arranged in a second direction and spaced apart from each other, the first direction and the second direction being orthogonal to each other.

In embodiments, a thickness of the upper output bumps may be greater than a thickness of the lower output bumps.

In embodiments, the substrate may further include a bending area disposed between the display area and the pad area, and the first output area of the circuit part may be disposed closer to the bending area than the second output area of the circuit part.

In embodiments, the first height may be defined as a distance from a top surface of the substrate to an uppermost surface of each of the first output pads, and the second height may be defined as a distance from the top surface of the substrate to an uppermost surface of each of the second output pads.

In embodiments, the display structure may include a lower electrode, a light emitting layer disposed on the lower electrode, and an upper electrode disposed on the light emitting layer.

A display device according to embodiments may include the first output pads, each having the first height that may be large (e.g., relatively). Even in case that the flow phenomenon of the lower protective film and the adhesive layer due to a difference in the force of a heating member occurs because of a difference in a number of bumps disposed in the first and second output areas and the input area, and the flow phenomenon of the lower protective film and the adhesive layer due to the heat of the heating member occurring because of the lower protective film and the adhesive layer, each having a low (e.g., relatively) Young's modulus, a contact failure between the upper output bumps and the first output pads may not occur. Accordingly, image quality of the display device may not deteriorate.

BRIEF DESCRIPTION OF THE DRAWINGS

Embodiments can be understood in more detail from the following description taken in conjunction with the accompanying drawings.

FIG. 2 is a schematic perspective view showing a state in which the display device of FIG. 1 is bent.

DETAILED DESCRIPTION OF THE EMBODIMENTS

Figure 1:
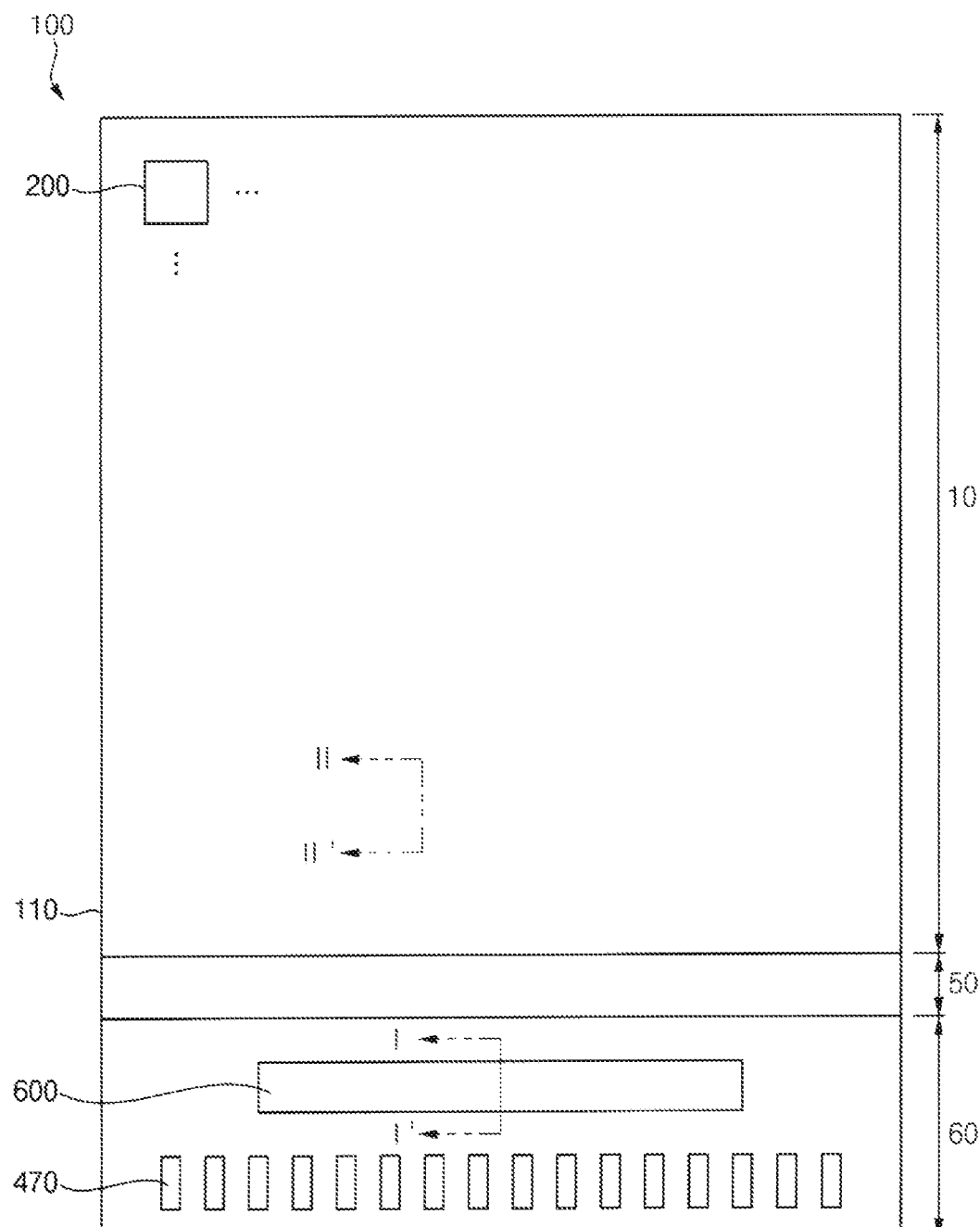
FIG. 1 is a schematic plan view showing a display device according to embodiments of the disclosure.

Hereinafter, display devices and a method of manufacturing a display device according to embodiments will be described in detail with reference to the accompanying drawings. In the accompanying drawings, the same or similar reference numerals refer to the same or similar elements.

As used herein, the singular forms, "a," "an," and "the" are intended to include the plural forms as well (and vice versa), unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

When an element is described as "not overlapping" or "to not overlap" another element, this may include that the elements are spaced apart from each other, offset from each other, or set aside from each other or any other suitable term as would be appreciated and understood by those of ordinary skill in the art.

"About", "approximately", and "substantially" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
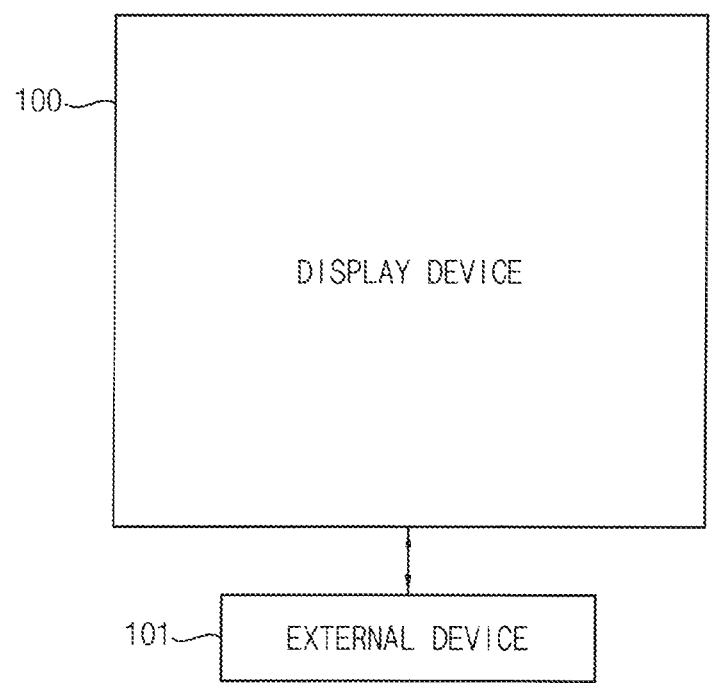
FIG. 3 is a schematic block diagram for describing an external device electrically connected to the display device of FIG. 1.

FIG. 1 is a schematic plan view showing a display device according to embodiments of the disclosure, and FIG. 2 is a schematic perspective view showing a state in which the display device of FIG. 1 is bent. FIG. 3 is a schematic block diagram for describing an external device electrically connected to the display device of FIG. 1.

Referring to FIGS. 1, 2, and 3, the display device 100 may include a substrate 110, a display structure 200, a driving integrated circuit 600, signal pads 470, and the like.

The substrate 110 including a transparent or opaque material may be provided. The substrate 110 may be formed of a transparent resin substrate. An example of the transparent resin substrate that may be used as the substrate 110 includes a polyimide substrate. The polyimide substrate may include a first polyimide layer, a barrier film layer, and a second polyimide layer.

The substrate 110 may include a display area 10, a bending area 50, and a pad area 60. The pad area 60 may be spaced apart from a side of the display area 10 in a first direction D1 that may be parallel to a top surface of the substrate 110. The bending area 50 may be located between the display area 10 and the pad area 60. As shown in FIG. 2, the bending area 50 may be bent in a second direction D2 that may be orthogonal to the first direction D1. The pad area 60 and the display area 10 may overlap each other in a third direction D3 that may be perpendicular to the first direction D1 and the second direction D2.

Referring again to FIGS. 1 to 3, signal pads 470 may be disposed in the pad area 60 on the substrate 110. The signal pads 470 may be arranged in the second direction D2 while being spaced apart from each other. Each of the signal pads 470 may include a metal, an alloy, metal nitride, conductive metal oxide, a transparent conductive material, and the like. These materials may be used alone or in combination with each other. In other embodiments, each of the signal pads 470 may have a multilayer structure including metal layers. For example, the metal layers may have mutually different thicknesses, or may include mutually different materials. An external device 101 may be electrically connected to the display device 100 through a flexible printed circuit board (FPCB) and the signal pads 470, and may provide a signal such as a gate signal, a data signal, a gate initialization signal, an initialization voltage, an emission control signal, a power supply voltage, and the like, to the display structure 200.

Display structures 200 configured to emit light (e.g., a display structure 200 of FIG. 7) may be disposed in the display area 10 on the substrate 110. The display structures 200 may be arranged in the first direction D1 and the second direction D2 in the display area 10. Wires connected to the display structures 200 may be disposed in the display area 10. For example, the wires may include a data signal wire, a gate signal wire, an emission control signal wire, a gate initialization signal wire, a power supply voltage wire, and the like.

Although each of the display area 10, the bending area 50, and the pad area 60 according to the disclosure has been described as having a rectangular shape when viewed in a plan view, the shape is not limited thereto. For example, each of the display area 10, the bending area 50, and the pad area 60 may have a triangular shape, a rhombic shape, a polygonal shape, a circular shape, a track shape, or an elliptical shape when viewed in a plan view.

In embodiments, the driving integrated circuit 600 may be disposed in the pad area 60 on the substrate 110. In other words, the driving integrated circuit 600 may be mounted on the substrate 110. The driving integrated circuit 600 will be described in detail below.

Figure 4:
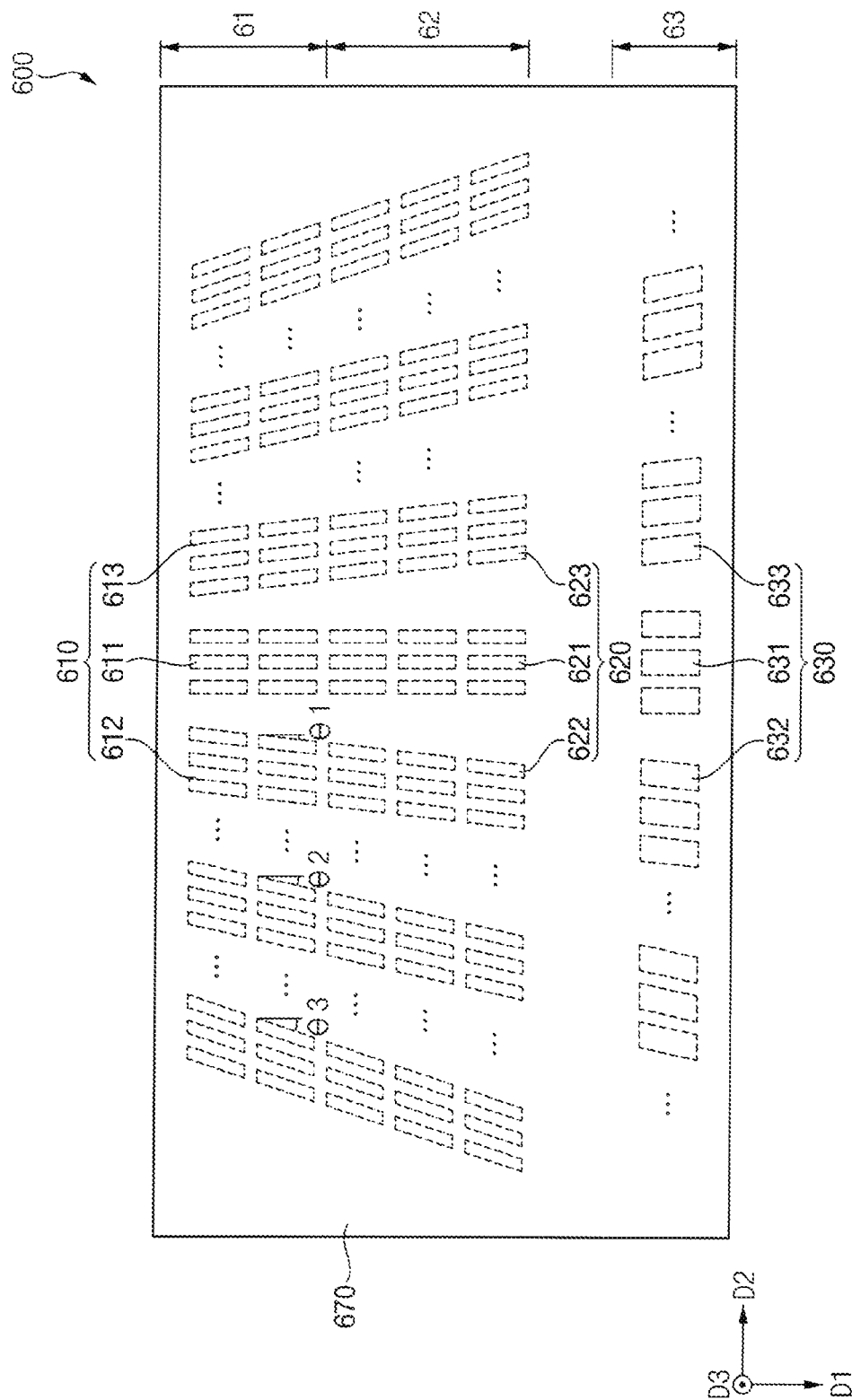
FIG. 4 is a schematic plan view for describing a driving integrated circuit included in the display device of FIG. 1.

FIG. 4 is a schematic plan view for describing a driving integrated circuit included in the display device of FIG. 1.

Referring to FIGS. 1 and 4, the driving integrated circuit 600 may include a circuit part 670, upper output bumps 610, lower output bumps 620, input bumps 630, and the like. The upper output bumps 610 may include a reference upper output bump 611, a first upper output bump 612, and a second upper output bump 613, and the lower output bumps 620 may include a reference lower output bump 621, a first lower output bump 622, and a second lower output bump 623. The input bumps 630 may include a reference input bump 631, a first input bump 632, and a second input bump 633. Furthermore, the circuit part 670 may include a first output area 61, a second output area 62, and an input area 63. For example, the first output area 61 may be adjacent to the display area 10 (or the bending area 50), and the input area 63 may be adjacent to the signal pads 470. In other words, the input area 63 may be spaced apart from the first output area 61 in the first direction D1, and the second output area 62 may be located between the first output area 61 and the input area 63. For example, the first output area 61 may be located closer to the bending area 50 than the second output area 62. In embodiments, in a plan view of the display device 100, the first output area 61 and the second output area 62 may be located consecutively (or adjacent to each other) in the first direction D1, and the input area 63 may be spaced apart from the second output area 62 in the first direction D1.

Bumps (e.g., the upper output bumps 610, the lower output bumps 620, and the input bumps 630) may be disposed in the first output area 61, the second output area 62, and the input area 63. In a plan view of the display device 100, the input area 63 may be spaced apart from the second output area 62 in the first direction D1, so that the bumps may not be disposed between the input area 63 and the second output area 62. The bumps may be disposed on a bottom surface of the circuit part 670.

In embodiments, in a plan view of the display device 100, the bumps may be arranged in two rows (e.g., defined as a first bump row and a second bump row) in the first output area 61, the bumps may be arranged in three rows (e.g., defined as a third bump row, a fourth bump row, and a fifth bump row) in the second output area 62, and the bumps may be arranged in one row (e.g., a sixth bump row) in the input area 63. Accordingly, in a plan view of the display device 100, a width of each of the first and second output areas 61 and 62 in the first direction D1 may be greater than a width of the input area 63 in the first direction D1.

The reference upper output bump 611 may be disposed in the first output area 61 on the bottom surface of the circuit part 670. A number of reference upper output bumps 611 may be defined according to a type of the display device 100 in which the driving integrated circuit 600 is used, and three reference upper output bumps 611 are shown in FIG. 4. However, for convenience of description, the three reference upper output bumps 611 may be defined as the reference upper output bump 611. The reference upper output bump 611 may extend in the first direction D1, and may be disposed substantially at a center of the first output area 61.

In the first output area 61 on the bottom surface of the circuit part 670, the first upper output bump 612 may be spaced apart from a first side (e.g., a left side) of the reference upper output bump 611, and may be inclined at a first angle θ1 with respect to the first direction D1. A number of the first upper output bumps 612 may be defined according to the type of the display device 100 in which the driving integrated circuit 600 may be used, and first upper output bumps 612 in which three bumps may be grouped into one group may be successively arranged as shown in FIG. 4. However, for convenience of description, the first upper output bumps 612 in which three bumps may be grouped into one group may be defined as the first upper output bump 612.

For example, in the first bump row, a first upper output bump 612 disposed in a first portion may have the first angle θ1, and a first upper output bump 612 disposed in a second portion may have a second angle θ2 that may be greater than the first angle θ1. A first upper output bump 612 disposed in a third portion may have a third angle θ3 that may be greater than the second angle θ2. In other words, an angle at which the first upper output bump 612 may be inclined with respect to the first direction D1 in a direction from the first portion to the third portion may gradually increase. The first portion, the second portion, and the third portion may be successively located in a direction opposite to the second direction D2. In other words, the second portion may be located on a left side of the first portion, and the third portion may be located on a left side of the second portion.

In the first output area 61 on the bottom surface of the circuit part 670, the second upper output bump 613 may be spaced apart from a second side (e.g., a right side) of the reference upper output bump 611, and may be symmetrical to the first upper output bump 612 with respect to the reference upper output bump 611. A number of the second upper output bumps 613 may be defined according to the type of the display device 100 in which the driving integrated circuit 600 may be used, and second upper output bumps 613 in which three bumps may be grouped into one group may be successively arranged in FIG. 4. However, for convenience of description, the second upper output bumps 613 in which three bumps may be grouped into one group may be defined as the second upper output bump 613.

For example, in the first bump row, a second upper output bump 613 disposed in a fourth portion may be symmetrical to the first upper output bump 612 disposed in the first portion and having the first angle θ1, and a second upper output bump 613 disposed in a fifth portion may be symmetrical to the first upper output bump 612 disposed in the second portion and having the second angle θ2. A second upper output bump 613 disposed in a sixth portion may be symmetrical to the first upper output bump 612 disposed in the third portion and having the third angle θ3. In other words, an angle at which the second upper output bump 613 may be inclined with respect to the first direction D1 in a direction from the fourth portion to the sixth portion may gradually increase. The fourth portion, the fifth portion, and the sixth portion may be successively located in the second direction D2. In other words, the fifth portion may be located on a right side of the fourth portion, and the sixth portion may be located on a right side of the fifth portion.

Accordingly, the reference upper output bump 611, the first upper output bump 612, and the second upper output bump 613 may be spaced apart from each other in the second direction D2, and the upper output bumps 610 may be disposed in the first bump row in the first output area 61. The upper output bumps 610 may be disposed in the second bump row in the first output area 61 in a similar way.

Although the first output area 61 has been described as having two bump rows, the configuration of the disclosure is not limited thereto. For example, the first output area 61 may have one bump row or at least three bump rows.

The reference lower output bump 621 may be disposed in the second output area 62 on the bottom surface of the circuit part 670. A number of reference lower output bumps 621 may be defined according to the type of the display device 100 in which the driving integrated circuit 600 may be used, and three reference lower output bumps 621 are shown in FIG. 4. However, for convenience of description, the three reference lower output bumps 621 may be defined as the reference lower output bump 621. The reference lower output bump 621 may extend in the first direction D1, and may be disposed substantially at a center of the second output area 62. The reference lower output bump 621 may be spaced apart from the reference upper output bump 611 in the first direction D1. For example, the reference lower output bump 621 disposed in the third bump row may be spaced apart from the reference upper output bump 611 disposed in the second bump row in the first direction D1.

In the second output area 62 on the bottom surface of the circuit part 670, the first lower output bump 622 may be spaced apart from a first side (e.g., a left side) of the reference lower output bump 621, and may be inclined at the first angle θ1 with respect to the first direction D1. A number of the first lower output bumps 622 may be defined according to the type of the display device 100 in which the driving integrated circuit 600 may be used, and first lower output bumps 622 in which three bumps may be grouped into one group may be successively arranged in FIG. 4. However, for convenience of description, the first lower output bumps 622 in which three bumps may be grouped into one group may be defined as the first lower output bump 622. The first lower output bump 622 may be spaced apart from the first upper output bump 612 in the first direction D1. For example, the first lower output bump 622 disposed in the third bump row may be spaced apart from the first upper output bump 612 disposed in the second bump row in the first direction D1.

For example, in the third bump row, a first lower output bump 622 disposed in a first portion may have the first angle θ1, and a first lower output bump 622 disposed in a second portion may have a second angle θ2 that may be greater than the first angle θ1. A first lower output bump 622 disposed in a third portion may have a third angle θ3 that may be greater than the second angle θ2. In other words, an angle at which the first lower output bump 622 may be inclined with respect to the first direction D1 in a direction from the first portion to the third portion may gradually increase. The first portion, the second portion, and the third portion may be successively located in a direction opposite to the second direction D2. In other words, the second portion may be located on a left side of the first portion, and the third portion may be located on a left side of the second portion.

In the second output area 62 on the bottom surface of the circuit part 670, the second lower output bump 623 may be spaced apart from a second side (e.g., a right side) of the reference lower output bump 621, and may be symmetrical to the first lower output bump 622 with respect to the reference lower output bump 621. A number of the second lower output bumps 623 may be defined according to the type of the display device 100 in which the driving integrated circuit 600 may be used, and second lower output bumps 623 in which three bumps may be grouped into one group may be successively arranged in FIG. 4. However, for convenience of description, the second lower output bumps 623 in which three bumps may be grouped into one group may be defined as the second lower output bump 623. The second lower output bump 623 may be spaced apart from the second upper output bump 613 in the first direction D1. For example, the second lower output bump 623 disposed in the third bump row may be spaced apart from the second upper output bump 613 disposed in the second bump row in the first direction D1.

For example, in the third bump row, a second lower output bump 623 disposed in a fourth portion may be symmetrical to the first lower output bump 622 disposed in the first portion and having the first angle θ1, and a second lower output bump 623 disposed in a fifth portion may be symmetrical to the first lower output bump 622 disposed in the second portion and having the second angle θ2. A second lower output bump 623 disposed in a sixth portion may be symmetrical to the first lower output bump 622 disposed in the third portion and having the third angle θ3. In other words, an angle at which the second lower output bump 623 may be inclined with respect to the first direction D1 in a direction from the fourth portion to the sixth portion may gradually increase. The fourth portion, the fifth portion, and the sixth portion may be successively located in the second direction D2. In other words, the fifth portion may be located on a right side of the fourth portion, and the sixth portion may be located on a right side of the fifth portion.

Accordingly, the reference lower output bump 621, the first lower output bump 622, and the second lower output bump 623 may be spaced apart from each other in the second direction D2, and the lower output bumps 620 may be disposed in the third bump row in the second output area 62. In this way, the lower output bumps 620 may be disposed in the fourth bump row and the fifth bump row in the second output area 62.

Although the second output area 62 has been described as having three bump rows, the configuration of the disclosure is not limited thereto. For example, the second output area 62 may have one bump row or at least two bump rows.

The reference input bump 631 may be disposed in the input area 63 on the bottom surface of the circuit part 670. A number of reference input bumps 631 may be defined according to the type of the display device 100 in which the driving integrated circuit 600 may be used, and three reference input bumps 631 are shown in FIG. 4. However, for convenience of description, the three reference input bumps 631 may be defined as the reference input bump 631. The reference input bump 631 may extend in the first direction D1, and may be disposed substantially at a center of the input area 63. The reference input bump 631 may be spaced apart from the reference lower output bump 621 disposed in the fifth bump row in the first direction D1. For example, the reference input bump 631 disposed in the sixth bump row may be spaced apart from the reference lower output bump 621 disposed in the fifth bump row in the first direction D1.

In the input area 63 on the bottom surface of the circuit part 670, the first input bump 632 may be spaced apart from a first side (e.g., a left side) of the reference input bump 631, and may be inclined at the first angle θ1 with respect to the first direction D1. A number of the first input bumps 632 may be defined according to the type of the display device 100 in which the driving integrated circuit 600 may be used, and first input bumps 632 in which three bumps may be grouped into one group may be successively arranged in FIG. 4. However, for convenience of description, the first input bumps 632 in which three bumps may be grouped into one group may be defined as the first input bump 632. The first input bump 632 may be spaced apart from the first lower output bump 622 in the first direction D1. For example, the first input bump 632 disposed in the sixth bump row may be spaced apart from the first lower output bump 622 disposed in the fifth bump row in the first direction D1.

For example, in the sixth bump row, a first input bump 632 disposed in a first portion may have the first angle θ1, and a first input bump 632 disposed in a second portion may have a second angle θ2 that may be greater than the first angle θ1. A first input bump 632 disposed in a third portion may have a third angle θ3 that may be greater than the second angle θ2. In other words, an angle at which the first input bump 632 may be inclined with respect to the first direction D1 in a direction from the first portion to the third portion may gradually increase. The first portion, the second portion, and the third portion may be successively located in a direction opposite to the second direction D2. In other words, the second portion may be located on a left side of the first portion, and the third portion may be located on a left side of the second portion.

In the input area 63 on the bottom surface of the circuit part 670, the second input bump 633 may be spaced apart from a second side (e.g., a right side) of the reference input bump 631, and may be symmetrical to the first input bump 632 with respect to the reference input bump 631. A number of the second input bumps 633 may be defined according to the type of the display device 100 in which the driving integrated circuit 600 may be used, and second input bumps 633 in which three bumps may be grouped into one group may be successively arranged in FIG. 4. However, for convenience of description, the second input bumps 633 in which three bumps may be grouped into one group may be defined as the second input bump 633. The second input bump 633 may be spaced apart from the second lower output bump 623 in the first direction D1. For example, the second input bump 633 disposed in the sixth bump row may be spaced apart from the second lower output bump 623 disposed in the fifth bump row in the first direction D1.

For example, in the sixth bump row, a second input bump 633 disposed in a fourth portion may be symmetrical to the first input bump 632 disposed in the first portion and having the first angle θ1, and a second input bump 633 disposed in a fifth portion may be symmetrical to the first input bump 632 disposed in the second portion and having the second angle θ2. A second input bump 633 disposed in a sixth portion may be symmetrical to the first input bump 632 disposed in the third portion and having the third angle θ3. In other words, an angle at which the second input bump 633 may be inclined with respect to the first direction D1 in a direction from the fourth portion to the sixth portion may gradually increase. The fourth portion, the fifth portion, and the sixth portion may be successively located in the second direction D2. In other words, the fifth portion may be located on a right side of the fourth portion, and the sixth portion may be located on a right side of the fifth portion.

Accordingly, the reference input bump 631, the first input bump 632, and the second input bump 633 may be spaced apart from each other in the second direction D2, and the input bumps 630 may be disposed in the sixth bump row in the input area 63.

Although the input area 63 has been described as having one bump row, the configuration of the disclosure is not limited thereto. For example, the input area 63 may have at least two bump rows.

In embodiments, in a plan view of the display device 100, an area of each of the upper output bumps 610 and the lower output bumps 620 may be smaller than an area of each of the input bumps 630. A distance between two adjacent input bumps 630 among the input bumps 630 may be greater than a distance between two adjacent upper output bumps 610 among the upper output bumps 610 or a distance between two adjacent lower output bumps 620 among the lower output bumps 620.

A drive IC chip may be mounted and disposed in the circuit part 670. For example, the drive IC chip may be mounted between the second output area 62 and the input area 63. A side (e.g., a lower side) of the drive IC chip may be electrically connected to the input bumps 630 through circuit wires, and an opposite side (e.g., a left side, a right side, or an upper side) of the drive IC chip may be electrically connected to the upper output bumps 610 and the lower output bumps 620 through circuit wires. The drive IC chip may receive an input signal (e.g., a data signal) and a drive IC power supply voltage from the external device 101 of FIG. 3 through the signal pads 470, input pads configured to connect the signal pads 470 to the input bumps 630 (e.g., input pads 730 of FIG. 5), and the input bumps 630, and the drive IC chip may provide an output signal to the display structure 200 through the upper output bumps 610, the lower output bumps 620, first output pads (e.g., first output pads 710 of FIG. 5), second output pads (e.g., second output pads 720 of FIG. 5), and wires (e.g., a data wire) configured to connect each of the first and second output pads to the display structure (e.g., the display structure 200 of FIG. 7) based on the input signal.

Accordingly, the driving integrated circuit 600 including the upper output bumps 610, the lower output bumps 620, the input bumps 630, and the circuit part 670 may be disposed in the pad area 60 on the substrate 110.

Figure 5:
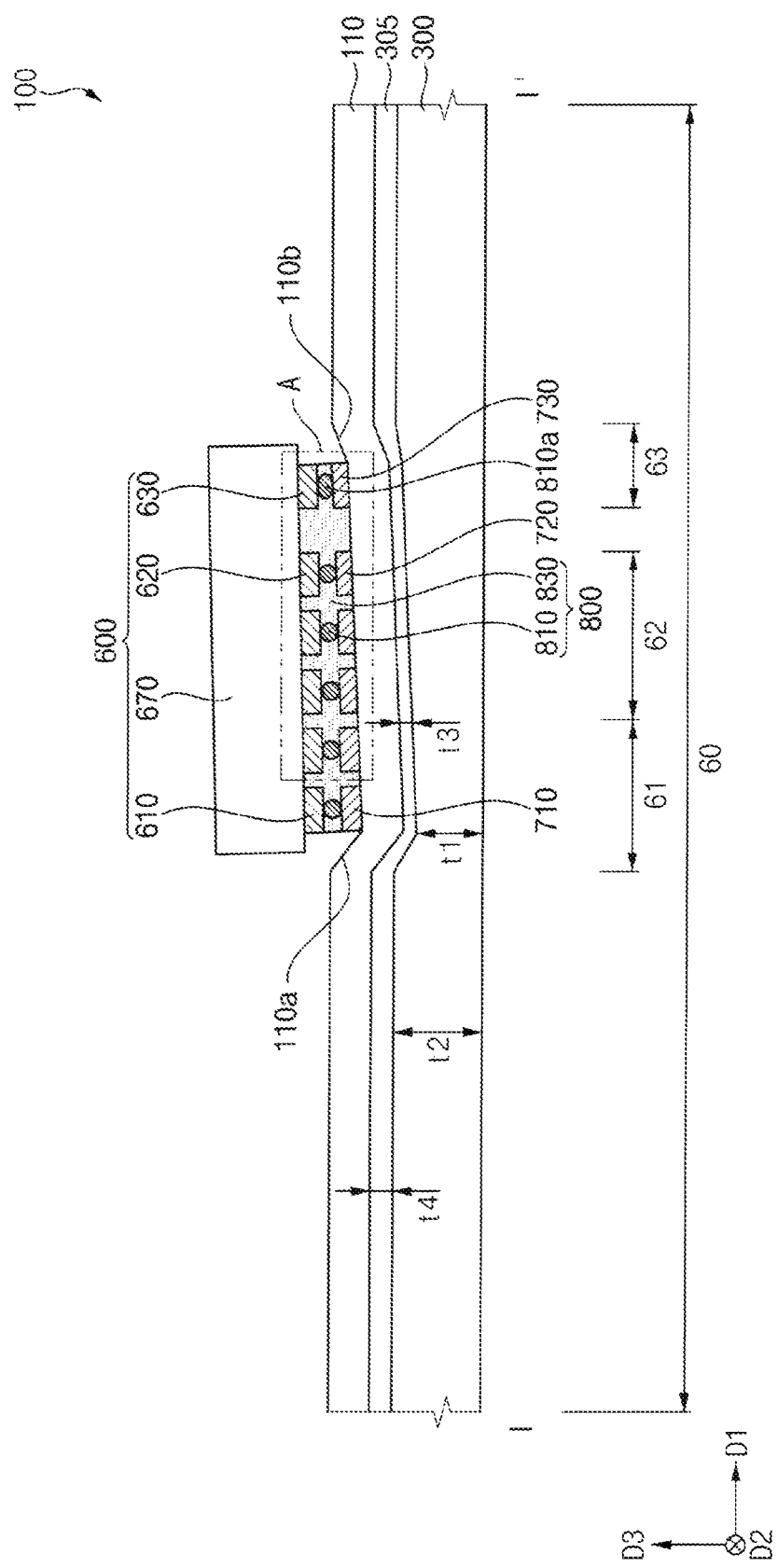
FIG. 5 is a schematic cross-sectional view taken along line I-I' of FIG. 1.
Figure 6:
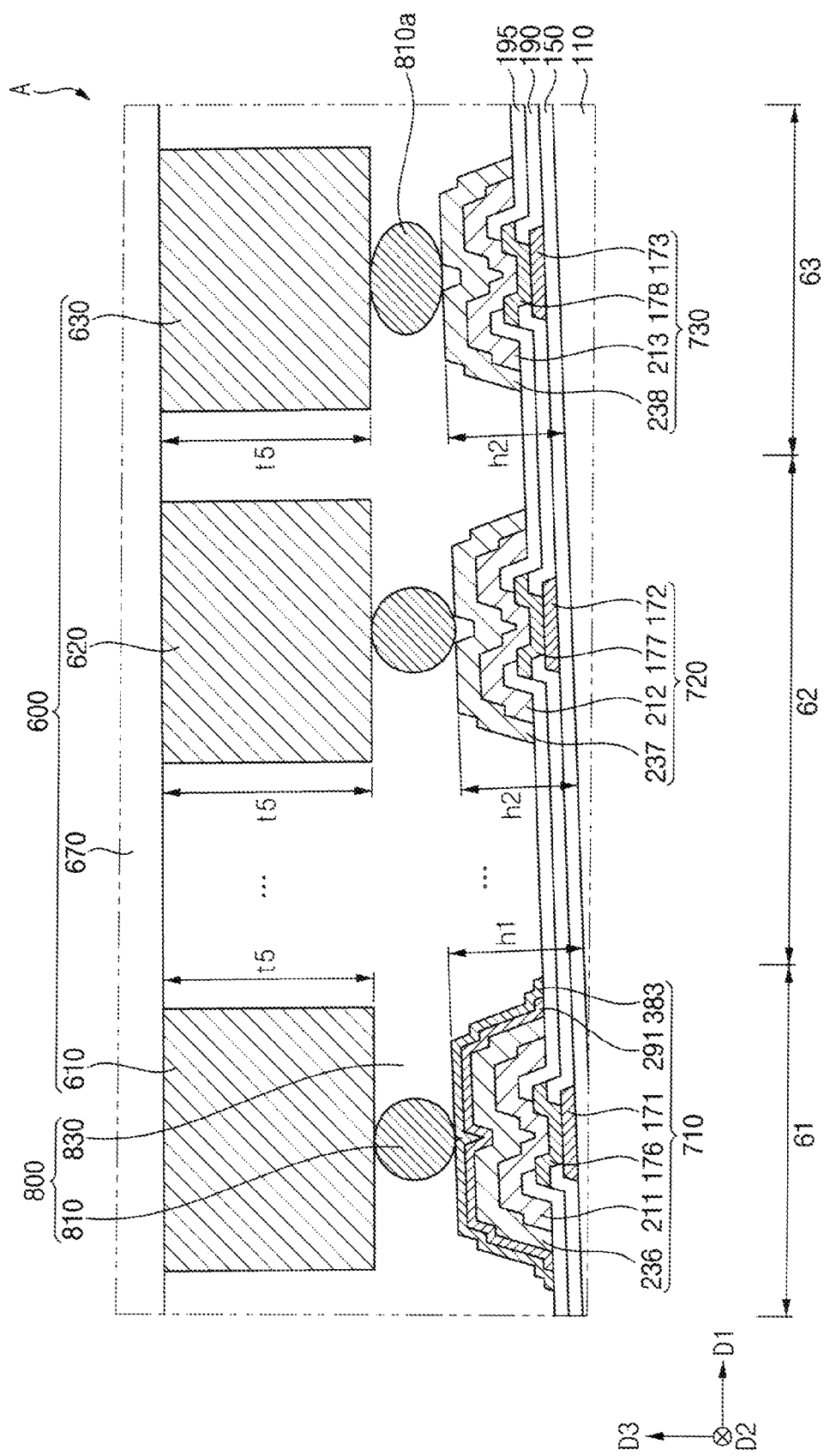
FIG. 6 is a partially enlarged schematic cross-sectional view showing region 'A' of FIG. 5.

FIG. 5 is a schematic cross-sectional view taken along line I-I' of FIG. 1, and FIG. 6 is a partially enlarged schematic cross-sectional view showing region 'A' of FIG. 5.

Referring to FIGS. 5 and 6, the display device 100 may include a substrate 110, first output pads 710, second output pads 720, input pads 730, a conductive film 800, a driving integrated circuit 600, an adhesive layer 305, a lower protective film 300, and the like. The conductive film 800 may include conductive balls 810 and a film layer 830.

Figure 12:
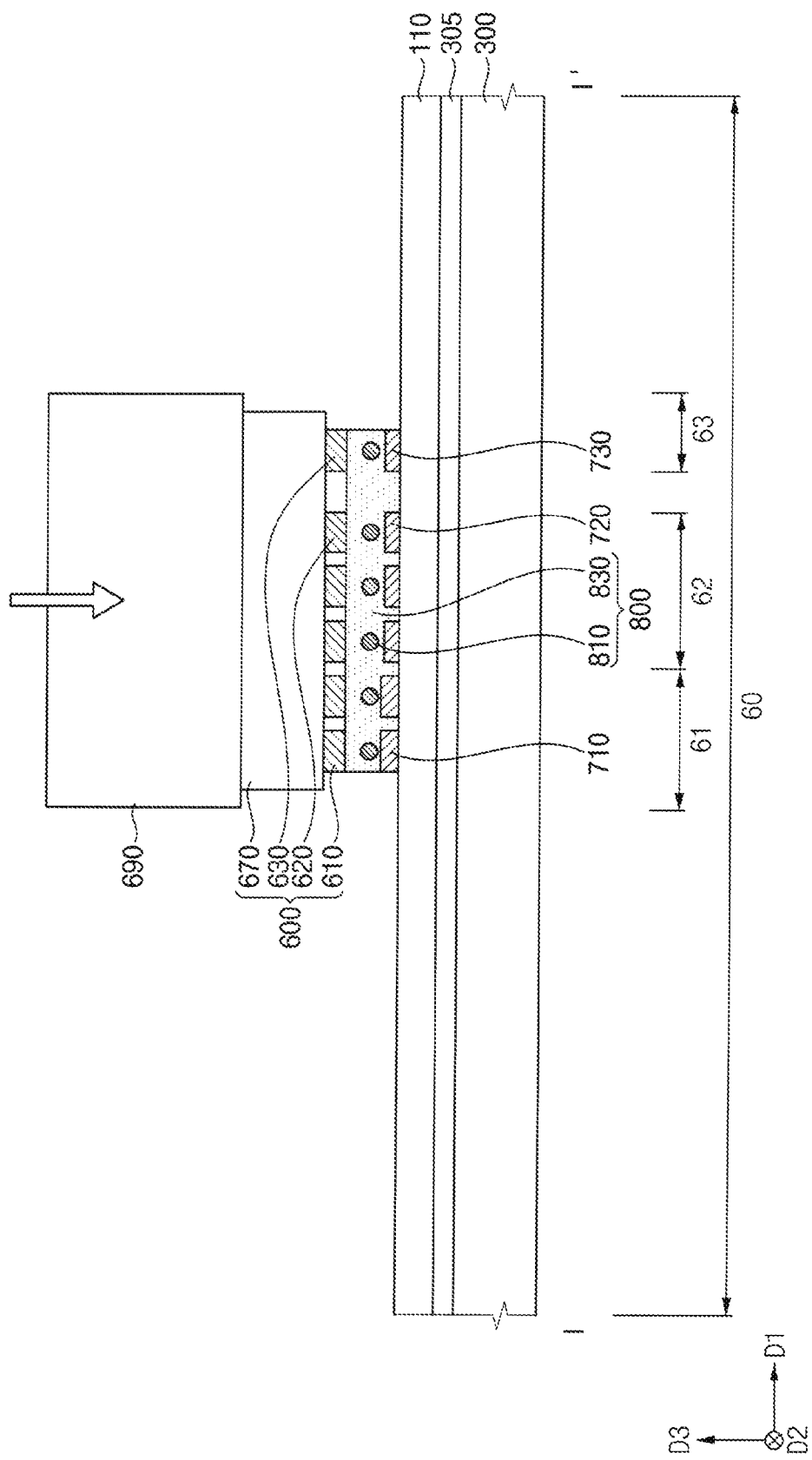
Figure 13:
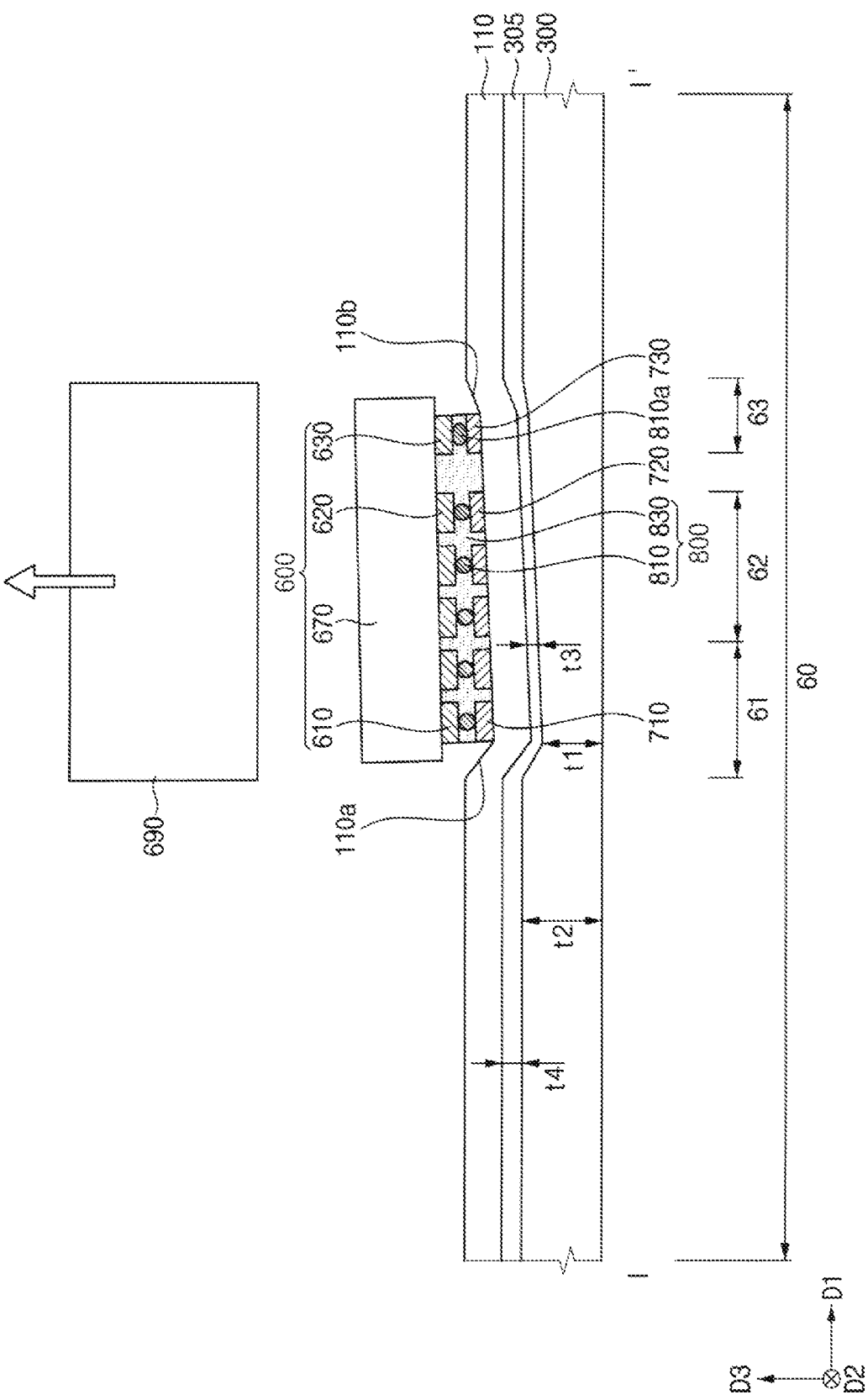

In embodiments, first and second steps 110a and 110b of the substrate 110 may be formed in a portion of the pad area 60 where the driving integrated circuit 600 may be disposed (e.g., a contact portion). For example, in a method of manufacturing the display device 100, as shown in FIGS. 12 and 13, a heating member 690 may apply heat and a force (or a pressure) to the driving integrated circuit 600 located in the pad area 60 on the substrate 110 in a direction opposite to the third direction D3, and each of the adhesive layer 305 and the lower protective film 300 has a low (e.g., relatively) Young's modulus, so that the adhesive layer 305 and the lower protective film 300 may flow to a portion that surrounds the portion where the driving integrated circuit 600 may be disposed (e.g., an outer peripheral portion) due to the force. The first and second steps 110a and 110b of the substrate 110 may be formed due to a flow phenomenon of each of the lower protective film 300 and the adhesive layer 305. In other words, a thickness t1 of the lower protective film 300 at the contact portion may be smaller than a thickness t2 of the lower protective film 300 at the outer peripheral portion, and a thickness t3 of the adhesive layer 305 at the contact portion may be smaller than a thickness t4 of the adhesive layer 305 at the outer peripheral portion.

An inclination of the first step 110a with respect to the first direction D1 may be steeper (e.g., relatively) than an inclination of the second step 110b with respect to the first direction D1. For example, one bump row exists in the input area 63 of the driving integrated circuit 600, and five bump rows exist in the first output area 61 and the second output area 62 of the driving integrated circuit 600. The force may be applied more (e.g., relatively) to the driving integrated circuit 600 that overlaps the first output area 61, and the lower protective film 300 and the adhesive layer 305 that overlap the first output area 61 may be pressed more (e.g., relatively), so that the flow phenomenon may occur more (e.g., relatively). Accordingly, the inclination of the first step 110a may be steeper (e.g., relatively) than the inclination of the second step 110b.

Although a thickness of the substrate 110 has been shown in FIGS. 5 and 13 as being substantially the same in the contact portion and the outer peripheral portion, the configuration of the disclosure is not limited thereto. For example, in other embodiments, the thickness of the substrate 110 in the contact portion may be thinner than the thickness of the substrate 110 in the outer peripheral portion.

The first output pads 710, the second output pads 720, and the input pads 730 may be disposed in the pad area 60 on the substrate 110.

The first output pads 710 may be disposed between the substrate 110 and the upper output bumps 610. In embodiments, each of the first output pads 710 may have a first height h1. For example, the first height h1 may be defined as a distance from the top surface of the substrate 110 to an uppermost surface of each of the first output pads 710. The first output pads 710 may overlap the upper output bumps 610, respectively. In other words, the first output pads 710 may overlap the first output area 61, and the first output pad 710 may be disposed on the substrate 110 in the same shape as each of the reference upper output bump 611, the first upper output bump 612, and the second upper output bump 613. For example, since the upper output bumps 610 may be arranged in two rows in the first output area 61, the first output pads 710 may also be arranged in two rows.

The second output pads 720 may be disposed between the substrate 110 and the lower output bumps 620. In embodiments, each of the second output pads 720 may have a second height h2 that may be smaller than the first height h1. For example, the second height h2 may be defined as a distance from the top surface of the substrate 110 to an uppermost surface of each of the second output pads 720. The second output pads 720 may overlap the lower output bumps 620, respectively. In other words, the second output pads 720 may overlap the second output area 62, and the second output pad 720 may be disposed on the substrate 110 in the same shape as each of the reference lower output bump 621, the first lower output bump 622, and the second lower output bump 623. For example, since the lower output bumps 620 may be arranged in three rows in the second output area 62, the second output pads 720 may also be arranged in three rows.

The input pads 730 may be disposed between the substrate 110 and the input bumps 630. In embodiments, each of the input pads 730 may have a height that may be equal to the height of each of the second output pads 720. For example, each of the input pads 730 may have the second height h2, and the second height h2 may be defined as a distance from the top surface of the substrate 110 to an uppermost surface of each of the input bumps 630. The input pads 730 may overlap the input bumps 630, respectively. In other words, the input pads 730 may overlap the input area 63, and the input pad 730 may be disposed on the substrate 110 in the same shape as each of the reference input bump 631, the first input bump 632, and the second input bump 633. For example, since the input bumps 630 may be arranged in one row in the input area 63, the input pads 730 may also be arranged in one row.

Each of the upper output bumps 610, the lower output bumps 620, the input bumps 630, the first output pads 710, the second output pads 720, and the input pads 730 may include a metal, an alloy, metal nitride, conductive metal oxide, a transparent conductive material, and the like, or a combination thereof. For example, each of the upper output bumps 610, the lower output bumps 620, the input bumps 630, the first output pads 710, the second output pads 720, and the input pads 730 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other embodiments, each of the upper output bumps 610, the lower output bumps 620, the input bumps 630, the first output pads 710, the second output pads 720, and the input pads 730 may have a multilayer structure including metal layers. For example, the metal layers may have mutually different thicknesses, or may include mutually different materials.

A stacked structure of each of the first output pads 710, the second output pads 720, and the input pads 730 will be described in detail below.

The conductive film 800 may be disposed between the driving integrated circuit 600 and the substrate 110. For example, the conductive balls 810 may be disposed inside the film layer 830. The conductive balls 810 may be arranged in the first direction D1 and the second direction D2 inside the film layer 830, and may be spaced apart from each other at equidistant intervals. In other words, the conductive balls 810 may be arranged on a single layer in a lattice shape, and may not overlap each other in the third direction D3.

A conductive ball 810 may be disposed between the upper output bump 610 and the first output pad 710, a conductive ball 810 may be disposed between the lower output bump 620 and the second output pad 720, and a conductive ball 810 may be disposed between the input bump 630 and the input pad 730. In other words, a conductive ball 810 may make direct contact with the upper output bump 610 and the first output pad 710, so that the conductive ball 810 may electrically connect the upper output bump 610 to the first output pad 710. A conductive ball 810 may make direct contact with the lower output bump 620 and the second output pad 720, so that the conductive ball 810 may electrically connect the lower output bump 620 to the second output pad 720. A conductive ball 810 may make direct contact with the input bump 630 and the input pad 730, so that a conductive ball 810 may electrically connect the input bump 630 to the input pad 730. In some embodiments, at least two conductive balls 810 may be disposed between the upper output bump 610 and the first output pad 710, between the lower output bump 620 and the second output pad 720, and between the input bump 630 and the input pad 730.

In embodiments, the conductive balls 810 may have a same size or shape (e.g., a circular shape when viewed in a plan view). However, similar to a shape of a conductive ball 810a disposed between the input pad 730 and the input bump 630, conductive balls 810 may have an elliptical shape when viewed in a plan view depending on the force applied by the heating member 690 during a process of manufacturing the display device 100. In other words, the conductive film 800 may selectively include at least one conductive ball 810a.

Each of the conductive balls 810 may have a structure in which a spherical polymer may be coated with a metal layer such as a nickel layer, a cobalt layer, a gold layer, a silver layer, a copper layer, or a combination thereof. The film layer 830 may include a thermosetting resin. For example, the film layer 830 may include an epoxy resin, an amino resin, a phenol resin, a urea resin, a melamine resin, an unsaturated polyester resin, a polyurethane resin, a polyimide resin, and the like, or a combination thereof.

Accordingly, the conductive film 800 including the conductive balls 810 and the film layer 830 may be provided. Since the conductive film 800 may be interposed between the upper output bumps 610, the lower output bumps 620 and the input bumps 630 and the first output pads 710, the second output pads 720 and the input pads 730, the driving integrated circuit 600 may be electrically connected to the display structure (e.g., the display structure 200 of FIG. 7). In other words, the drive IC chip included in the driving integrated circuit 600 may control driving of the display structure.

The lower protective film 300 may be disposed on the bottom surface of the substrate 110. The lower protective film 300 may protect the bottom surface of the substrate 110. In some embodiments, the lower protective film 300 may not be disposed in the bending area 50. In other words, the lower protective film 300 may expose the bottom surface of the substrate 110 located in the bending area 50. The substrate 110 located in the bending area 50 may be easily bent. As described above, the lower protective film 300 may have mutually different thicknesses in the contact portion, which may be a portion where the driving integrated circuit 600 may be disposed, and the outer peripheral portion, which may be a portion that surrounds the portion where the driving integrated circuit 600 may be disposed.

The lower protective film 300 may include an organic insulating material such as a photoresist, a polyacryl-based resin, a polyimide-based resin, a polyamide-based resin, a siloxane-based resin, an acryl-based resin, an epoxy-based resin, and the like, or a combination thereof. In other embodiments, the lower protective film 300 may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), and the like, or a combination thereof. In embodiments, the lower protective film 300 may include at least one of polyimide or heat-resistant PET. A Young's modulus of the polyimide may be approximately 3,900 MPa at a room temperature (e.g., about 25 degrees), and approximately 2,600 MPa at a high temperature (e.g., about 150 degrees). A Young's modulus of the heat-resistant PET may be approximately 4,700 MPa at the room temperature, and approximately 800 MPa at the high temperature.

For example, in the display device 100 having a structure in which an optical module may be disposed on a bottom surface of the lower protective film 300, the optical module may collect light passing through the lower protective film 300 to obtain an image. In case that the lower protective film 300 includes the polyimide, since the polyimide may have a yellow color, image quality of the optical module may deteriorate (e.g., relatively). In contrast, in case that the lower protective film 300 includes the heat-resistant PET, since the heat-resistant PET may be substantially transparent, the image quality of the optical module may be improved (e.g., relatively). Accordingly, in the display device 100 having the above structure, the lower protective film 300 may include the heat-resistant PET. However, in the process of manufacturing the display device 100, the Young's modulus of the heat-resistant PET becomes small (e.g., relatively) due to the heat applied by the heating member 690, and the flow phenomenon occurs, so that a groove may be formed in the lower protective film 300 to overlap the contact portion. The first and second steps 110a and 110b of the substrate 110 may be formed by the groove.

The adhesive layer 305 may be interposed between the substrate 110 and the lower protective film 300. The adhesive layer 305 may be disposed along a profile of the groove of the lower protective film 300. As described above, the adhesive layer 305 may have different thicknesses in the contact portion and the outer peripheral portion.

The adhesive layer 305 may bond the lower protective film 300 to the bottom surface of the substrate 110. The adhesive layer 305 may include an optical-clear adhesive (OCA), a pressure sensitive adhesive (PSA), an optical-clear resin (OCR), and the like, or a combination thereof. For example, the adhesive layer 305 may include PET, PEN, PP, PC, PS, PSul, PE, PPA, PES, PAR, PCO, MPPO, a photo-curable resin, a thermosetting resin, and the like, or a combination thereof. In case that the adhesive layer 305 also includes a material having a low Young's modulus (e.g., PET), the flow phenomenon may occur due to the heat applied by the heating member 690.

For example, in a conventional display device, due to a flow phenomenon of each of a lower protective film and an adhesive layer, a groove may be formed in the lower protective film, and a step may be formed in a substrate. Due to the step, a contact failure may occur between output and input pads and output and input bumps of a driving integrated circuit.

Since one bump row exists in an input area of the driving integrated circuit, and five bump rows exist in an output area of the driving integrated circuit, the force may be applied more (e.g., relatively) to the driving integrated circuit that overlaps an outer periphery of the output area, and the lower protective film and the adhesive layer that overlap the output area may be pressed more (e.g., relatively), so that the flow phenomenon may occur more (e.g., relatively). In other words, a distance between the output pad and the output bump in the output area may be greater than a distance between the input pad and the input bump in the input area, and the contact failure between the output pad and the output bump may occur. In case that the contact failure occurs, quality of an image of the conventional display device may deteriorate.

Since a display device 100 according to embodiments of the disclosure may include the first output pads 710, each having the first height h1 that may be large (e.g., relatively), even in case that the flow phenomenon of the lower protective film 300 and the adhesive layer 305 due to a difference in the force of the heating member 690 occurs because of a difference in a number of bumps disposed in the first and second output areas 61 and 62 and the input area 63, and the flow phenomenon of the lower protective film 300 and the adhesive layer 305 due to the heat of the heating member 690 occurs because of the lower protective film 300 and the adhesive layer 305, each having a low (e.g., relatively) Young's modulus, a contact failure between the upper output bumps 610 and the first output pads 710 may not occur. Accordingly, image quality of the display device 100 may not deteriorate.

In other embodiments, the lower protective film 300 may make direct contact with the bottom surface of the substrate 110. For example, in case that the lower protective film 300 may be formed by using a resin, the lower protective film 300 may be formed by printing the resin directly on the bottom surface of the substrate 110 without the adhesive layer 305. In other words, the adhesive layer 305 may be omitted.

Figure 7:
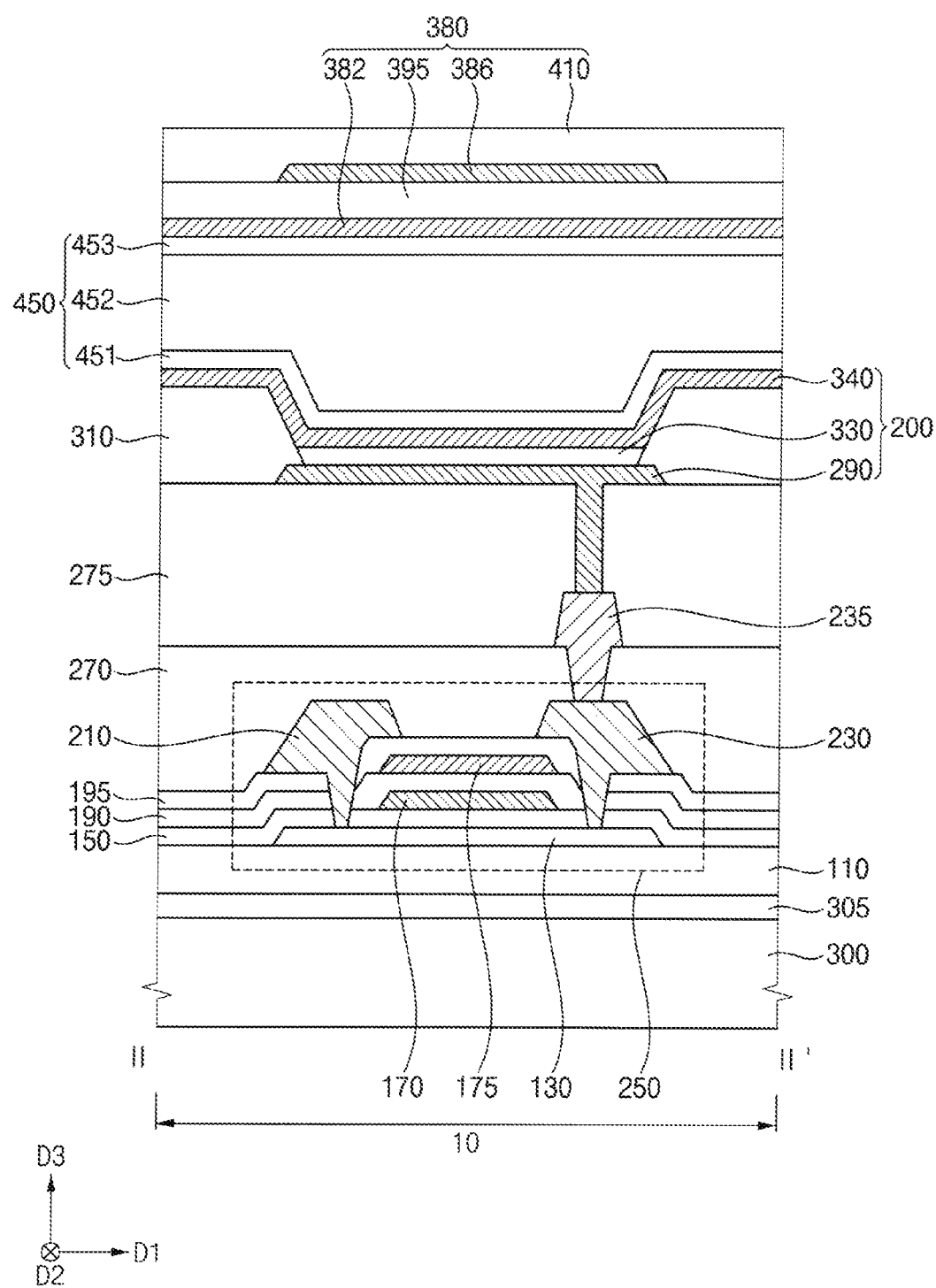
FIG. 7 is a schematic cross-sectional view taken along line II-II' of FIG. 1.
Figure 8:
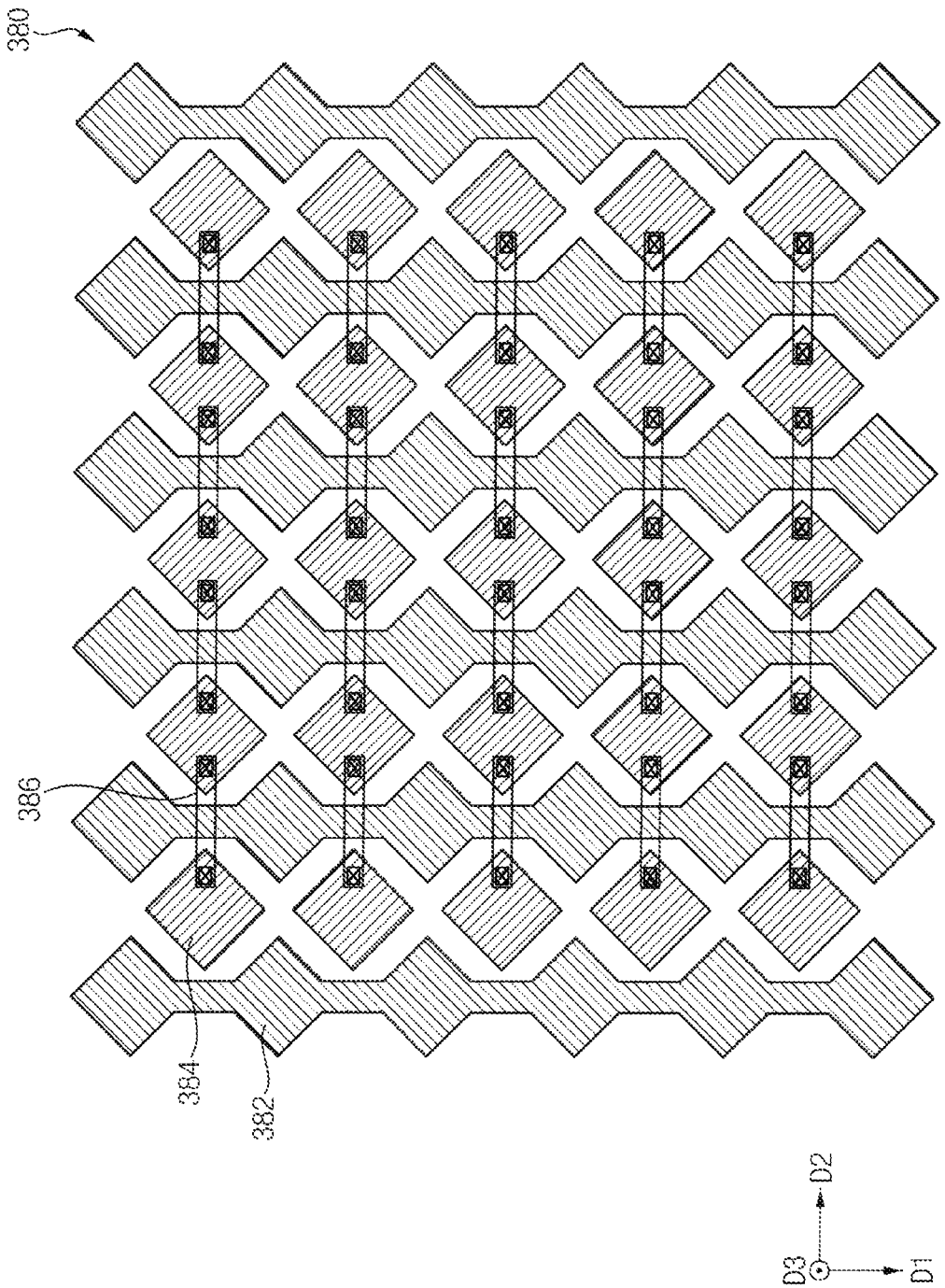
FIG. 8 is a schematic plan view for describing a sensing structure included in the display device of FIG. 7.
Figure 9:
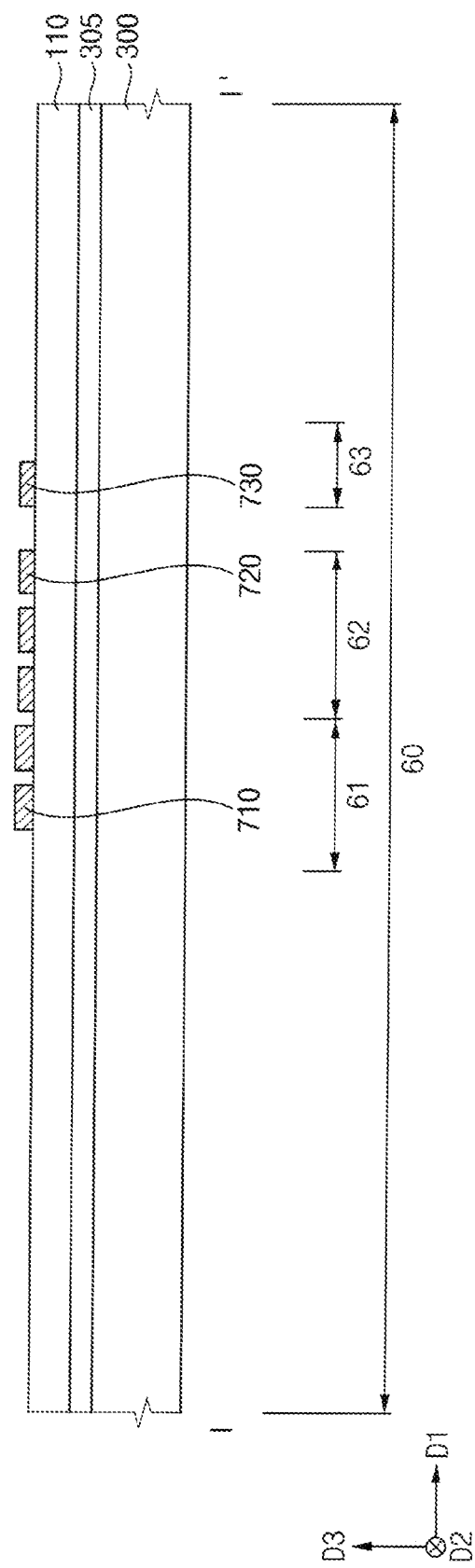
FIGS. 9 to 13 are schematic cross-sectional views showing a method of manufacturing a display device according to embodiments of the disclosure.

FIG. 7 is a schematic cross-sectional view taken along line II-II' of FIG. 1, and FIG. 8 is a schematic plan view for describing a sensing structure included in the display device of FIG. 7.

Referring to FIGS. 6, 7 and 8, the display device 100 may include a lower protective film 300, an adhesive layer 305, a substrate 110, a semiconductor element 250, a gate insulating layer 150, a first interlayer insulating layer 190, a second interlayer insulating layer 195, a connection electrode 235, a first planarization layer 270, a second planarization layer 275, a pixel defining layer 310, a display structure 200, a thin film encapsulation structure 450, a sensing structure 380, a conductive film 800, a first output pad 710, a second output pad 720, an input pad 730, a driving integrated circuit 600, and the like. The semiconductor element 250 may include an active layer 130, a first gate electrode 170, a second gate electrode 175, a source electrode 210, and a drain electrode 230, and the display structure 200 may include a lower electrode 290, a light emitting layer 330, and an upper electrode 340. The thin film encapsulation structure 450 may include a first inorganic thin film encapsulation layer 451, an organic thin film encapsulation layer 452, and a second inorganic thin film encapsulation layer 453, and the sensing structure 380 may include first sensing electrodes 382, second sensing electrodes 384, sensing connection electrodes 386, a first insulating layer 395, and a second insulating layer 410. Moreover, the conductive film 800 may include conductive balls 810 and a film layer 830, and the driving integrated circuit 600 may include upper output bumps 610, lower output bumps 620, input bumps 630, and a circuit part 670.

In embodiments, the first output pad 710 may include a first gate pattern 171, a fourth gate pattern 176, a first electrode pattern 211, a fourth electrode pattern 236, a seventh electrode pattern 291, and an eighth electrode pattern 383, the second output pad 720 may include a second gate pattern 172, a fifth gate pattern 177, a second electrode pattern 212, and a fifth electrode pattern 237, and the input pad 730 may include a third gate pattern 173, a sixth gate pattern 178, a third electrode pattern 213, and a sixth electrode pattern 238.

The substrate 110 may be provided, the adhesive layer 305 may be disposed on the bottom surface of the substrate 110, and the lower protective film 300 may be disposed on a bottom surface of the adhesive layer 305.

A buffer layer may also be disposed on the substrate 110. The buffer layer may prevent metal atoms or impurities from diffusing from the substrate 110 to an upper structure (e.g., the semiconductor element 250, the display structure 200, etc.), and may control a heat transfer rate during a crystallization process for forming the active layer 130 to obtain a substantially uniform active layer 130. In case that a surface of the substrate 110 is not uniform, the buffer layer may serve to improve flatness of the surface of the substrate 110. Depending on a type of the substrate 110, two or more buffer layers may be provided on the substrate 110, or the buffer layer may not be provided. The buffer layer may include an organic insulating material or an inorganic insulating material.

The active layer 130 may be disposed in the display area 10 on the substrate 110. The active layer 130 may include a metal oxide semiconductor, an inorganic semiconductor (e.g., amorphous silicon or poly silicon), an organic semiconductor, or the like. The active layer 130 may have a source region and a drain region.

The gate insulating layer 150 may be disposed in the display area 10 and the pad area 60 on the substrate 110 and the active layer 130. For example, the gate insulating layer 150 may be disposed along a profile of the active layer 130 with a uniform thickness to cover the active layer 130 on the substrate 110. In other embodiments, the gate insulating layer 150 may sufficiently cover the active layer 130 on the substrate 110, and may have a substantially flat top surface without creating a step around the active layer 130. The gate insulating layer 150 may include a silicon compound, metal oxide, and the like, or a combination thereof. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like, or a combination thereof. In other embodiments, the gate insulating layer 150 may have a multilayer structure including insulating layers. For example, the insulating layers may have mutually different thicknesses, or may include mutually different materials.

The first gate electrode 170 may be disposed in the display area 10 on the first gate insulating layer 150. In other words, the gate electrode 170 may be disposed on a portion of the gate insulating layer 150 under which the active layer 130 may be located.

The first gate pattern 171 may be disposed in the first output area 61 on the gate insulating layer 150, the second gate pattern 172 may be disposed in the second output area 62 on the gate insulating layer 150, and the third gate pattern 173 may be disposed in the input area 63 on the gate insulating layer 150.

The first gate electrode 170, the first gate pattern 171, the second gate pattern 172, and the third gate pattern 173 may be disposed on the same layer, and each of the first gate electrode 170, the first gate pattern 171, the second gate pattern 172, and the third gate pattern 173 may include a metal, a metal alloy, metal nitride, conductive metal oxide, a transparent conductive material, and the like, or a combination thereof. In other embodiments, each of the first gate electrode 170, the first gate pattern 171, the second gate pattern 172, and the third gate pattern 173 may have a multilayer structure including metal layers. For example, the metal layers may have mutually different thicknesses, or may include mutually different materials.

The first interlayer insulating layer 190 may be disposed in the display area 10 and the pad area 60 on the first gate electrode 170, the first gate pattern 171, the second gate pattern 172, the third gate pattern 173, and the gate insulating layer 150. For example, the first interlayer insulating layer 190 may cover the first gate electrode 170 in the display area 10 on the gate insulating layer 150, and may be disposed in the pad area 60 on the gate insulating layer 150 with a uniform thickness while exposing a part of a top surface of each of the first gate pattern 171, the second gate pattern 172, and the third gate pattern 173. In other embodiments, the first interlayer insulating layer 190 may have a substantially flat top surface without creating a step around the first gate electrode 170, the first gate pattern 171, the second gate pattern 172, and the third gate pattern 173 on the gate insulating layer 150. The first interlayer insulating layer 190 may include a silicon compound, metal oxide, and the like. In other embodiments, the first interlayer insulating layer 190 may have a multilayer structure including insulating layers. For example, the insulating layers may have mutually different thicknesses, or may include mutually different materials.

The second gate electrode 175 may be disposed in the display area 10 on the first interlayer insulating layer 190. In other words, the second gate electrode 175 may be disposed on a portion of the first interlayer insulating layer 190 under which the second gate electrode 175 may be located.

In the pad area 60, the fourth gate pattern 176 may be disposed on the first gate pattern 171, the fifth gate pattern 177 may be disposed on the second gate pattern 172, and the sixth gate pattern 178 may be disposed on the third gate pattern 173.

The second gate electrode 175, the fourth gate pattern 176, the fifth gate pattern 177, and the sixth gate pattern 178 may be disposed on the same layer, and each of the second gate electrode 175, the fourth gate pattern 176, the fifth gate pattern 177, and the sixth gate pattern 178 may include a metal, a metal alloy, metal nitride, conductive metal oxide, a transparent conductive material, and the like, or a combination thereof. In other embodiments, each of the second gate electrode 175, the fourth gate pattern 176, the fifth gate pattern 177, and the sixth gate pattern 178 may have a multilayer structure including metal layers. For example, the metal layers may have mutually different thicknesses, or may include mutually different materials.

The second interlayer insulating layer 195 may be disposed in the display area 10 and the pad area 60 on the first interlayer insulating layer 190, the second gate electrode 175, the fourth gate pattern 176, the fifth gate pattern 177, and the sixth gate pattern 178. For example, the second interlayer insulating layer 195 may cover the second gate electrode 175 in the display area 10 on the first interlayer insulating layer 190, and may be disposed in the pad area 60 on the first interlayer insulating layer 190 with a uniform thickness while exposing a part of a top surface of each of the second gate electrode 175, the fourth gate pattern 176, the fifth gate pattern 177, and the sixth gate pattern 178. In other embodiments, the second interlayer insulating layer 195 may have a substantially flat top surface without creating a step around the second gate electrode 175, the fourth gate pattern 176, the fifth gate pattern 177, and the sixth gate pattern 178 on the first interlayer insulating layer 190. The second interlayer insulating layer 195 may include a silicon compound, metal oxide, and the like. In other embodiments, the second interlayer insulating layer 195 may have a multilayer structure including insulating layers. For example, the insulating layers may have mutually different thicknesses, or may include mutually different materials.

The source electrode 210 and the drain electrode 230 may be disposed in the display area 10 on the second interlayer insulating layer 195. The source electrode 210 may be connected to the source region of the active layer 130 through a contact hole formed by removing first portions of the gate insulating layer 150, the first interlayer insulating layer 190, and the second interlayer insulating layer 195, and the drain electrode 230 may be connected to the drain region of the active layer 130 through a contact hole formed by removing second portions of the gate insulating layer 150, the first interlayer insulating layer 190, and the second interlayer insulating layer 195.

Accordingly, the semiconductor element 250 including the active layer 130, the gate electrode 170, the source electrode 210, and the drain electrode 230 may be provided.

In the pad area 60, the first electrode pattern 211 may be disposed on the fourth gate pattern 176, the second electrode pattern 212 may be disposed on the fifth gate pattern 177, and the third electrode pattern 213 may be disposed on the sixth gate pattern 178.

The first electrode pattern 211, the second electrode pattern 212, the third electrode pattern 213, the source electrode 210, and the drain electrode 230 may be disposed on the same layer, and each of the first electrode pattern 211, the second electrode pattern 212, the third electrode pattern 213, the source electrode 210, and the drain electrode 230 may include a metal, a metal alloy, metal nitride, conductive metal oxide, a transparent conductive material, and the like. These may be used alone or in combination with each other. In other embodiments, each of the first electrode pattern 211, the second electrode pattern 212, the third electrode pattern 213, the source electrode 210, and the drain electrode 230 may have a multilayer structure including metal layers. For example, the metal layers may have mutually different thicknesses, or may include mutually different materials.

The first planarization layer 270 may be disposed in the display area 10 on the second interlayer insulating layer 195, the source electrode 210, and the drain electrode 230. In other words, the first planarization layer 270 may not be disposed in the pad area 60 on the second interlayer insulating layer 195. For example, the first planarization layer 270 may have a thick (e.g., relatively) thickness to sufficiently cover the source and drain electrodes 210 and 230 on the second interlayer insulating layer 195. The first planarization layer 270 may have a substantially flat top surface. In order to implement such a flat top surface of the first planarization layer 270, a planarization process may be additionally performed on the first planarization layer 270. The first planarization layer 270 may have a contact hole that exposes a top surface of the drain electrode 230. The first planarization layer 270 may include an organic insulating material or an inorganic insulating material. In embodiments, the first planarization layer 270 may include an organic insulating material. For example, the first planarization layer 270 may include a photoresist, a polyacryl-based resin, a polyimide-based resin, a polyamide-based resin, a siloxane-based resin, an acryl-based resin, an epoxy-based resin, and the like, or a combination thereof.

The connection electrode 235 may be disposed in the display area 10 on the first planarization layer 270. The connection electrode 235 may make direct contact with the drain electrode 230 through the contact hole of the first planarization layer 270.

In the pad area 60, the fourth electrode pattern 236 may be disposed on the first electrode pattern 211, the fifth electrode pattern 237 may be disposed on the second electrode pattern 212, and the sixth electrode pattern 238 may be disposed on the third electrode pattern 213.

The fourth electrode pattern 236, the fifth electrode pattern 237, the sixth electrode pattern 238, and the connection electrode 235 may include a metal, a metal alloy, metal nitride, conductive metal oxide, a transparent conductive material, and the like. These may be used alone or in combination with each other. In other embodiments, the fourth electrode pattern 236, the fifth electrode pattern 237, the sixth electrode pattern 238, and the connection electrode 235 may have a multilayer structure including metal layers. For example, the metal layers may have mutually different thicknesses, or may include mutually different materials.

Accordingly, the second output pad 720 including the second gate pattern 172, the fifth gate pattern 177, the second electrode pattern 212, and the fifth electrode pattern 237, and the input pad 730 including the third gate pattern 173, the sixth gate pattern 178, the third electrode pattern 213, and the sixth electrode pattern 238 may be provided. In embodiments, each of the second output pad 720 and the input pad 730 may have the second height h2.

Although the second output pad 720 has been described as having a stacked structure including the second gate pattern 172, the fifth gate pattern 177, the second electrode pattern 212, and the fifth electrode pattern 237, and the input pad 730 has been described as having a stacked structure including the third gate pattern 173, the sixth gate pattern 178, the third electrode pattern 213, and the sixth electrode pattern 238, the stacked structure of each of the second output pad 720 and the input pad 730 is not limited thereto. For example, the stacked structure of each of the second output pad 720 and the input pad 730 may be appropriately modified according to the second height h2 (e.g., a distance from the top surface of the substrate 110 to a bottom surface of the conductive ball 810) that may vary.

The second planarization layer 275 may be disposed on the connection electrode 235 and the first planarization layer 270. In other words, the second planarization layer 275 may not be disposed in the pad area 60. For example, the second planarization layer 275 may have a thick (e.g., relatively) thickness to sufficiently cover the connection electrode 235 on the first planarization layer 270. The second planarization layer 275 may have a substantially flat top surface. In order to implement such a flat top surface of the second planarization layer 275, a planarization process may be additionally performed on the second planarization layer 275. The second planarization layer 275 may have a contact hole that exposes a top surface of the connection electrode 235. The second planarization layer 275 may include an organic insulating material or an inorganic insulating material. In embodiments, the second planarization layer 275 may include an organic insulating material.

The lower electrode 290 may be disposed in the display area 10 on the second planarization layer 275. The lower electrode 290 may make direct contact with the connection electrode 235 through the contact hole of the second planarization layer 275, and the lower electrode 290 may be electrically connected to the semiconductor element 250.

In the first output area 61, the seventh electrode pattern 291 may be disposed on the fourth electrode pattern 236.

The fourth electrode pattern 236 and the lower electrode 290 may include a metal, a metal alloy, metal nitride, conductive metal oxide, a transparent conductive material, and the like. These may be used alone or in combination with each other. In other embodiments, the lower electrode 290 may have a multilayer structure including metal layers. For example, the metal layers may have mutually different thicknesses, or may include mutually different materials.

The pixel defining layer 310 may be disposed in the display area 10 on the second planarization layer 275. For example, the pixel defining layer 310 may not be disposed in the pad area 60. In other words, the pixel defining layer 310 may be disposed on a part of the lower electrode 290 and the second planarization layer 275 in the display area 10. The pixel defining layer 310 may cover both side portions of the lower electrode 290, and may have an opening that exposes a part of a top surface of the lower electrode 290. The pixel defining layer 310 may be formed of an organic insulating material or an inorganic insulating material. In embodiments, the pixel defining layer 310 may include an organic insulating material.

The light emitting layer 330 may be disposed in the display area 10 on the lower electrode 290. In other words, the light emitting layer 330 may be disposed on the lower electrode 290 exposed by the opening of the pixel defining layer 310. The light emitting layer 330 may be formed by using at least one of light emitting materials for emitting different color lights (e.g., red light, green light, blue light, etc.) according to a type of a sub-pixel. In other embodiments, the light emitting layer 330 may be formed by stacking light emitting materials for generating different color lights such as red light, green light, and blue light to emit white light as a whole.

The upper electrode 340 may be disposed in the display area 10 on the pixel defining layer 310 and the light emitting layer 330. The upper electrode 340 may include a metal, a metal alloy, metal nitride, conductive metal oxide, a transparent conductive material, and the like. These may be used alone or in combination with each other. In other embodiments, the upper electrode 340 may have a multilayer structure including metal layers. For example, the metal layers may have mutually different thicknesses, or may include mutually different materials.

Accordingly, the display structure 200 including the lower electrode 290, the light emitting layer 330, and the upper electrode 340 may be provided.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the display structure 200 from deteriorating due to penetration of moisture, oxygen, and the like. The first inorganic thin film encapsulation layer 451 may perform a function of protecting the display structure 200 from an external impact. The first inorganic thin film encapsulation layer 451 may include inorganic insulating materials having flexibility.

The organic thin film encapsulation layer 452 may be disposed on the first inorganic thin film encapsulation layer 451. The organic thin film encapsulation layer 452 may improve flatness of the display device 100, and may protect the display structure 200 together with the first inorganic thin film encapsulation layer 451. The organic thin film encapsulation layer 452 may include organic materials having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the display structure 200 from deteriorating due to the penetration of moisture, oxygen, and the like together with the first inorganic thin film encapsulation layer 451. The second inorganic thin film encapsulation layer 453 may perform a function of protecting the display structure 200 from an external impact together with the first inorganic thin film encapsulation layer 451 and the organic thin film encapsulation layer 452. The second inorganic thin film encapsulation layer 453 may include the inorganic insulating materials having flexibility.

Accordingly, the thin film encapsulation structure 450 including the first inorganic thin film encapsulation layer 451, the organic thin film encapsulation layer 452, and the second inorganic thin film encapsulation layer 453 may be provided.

In other embodiments, the thin film encapsulation structure 450 may have a five-layer structure in which three inorganic thin film encapsulation layers and two organic thin film encapsulation layers may be stacked, or a seven-layer structure in which four inorganic thin film encapsulation layers and three organic thin film encapsulation layers may be stacked.

The first sensing electrodes 382 and the second sensing electrodes 384 may be disposed in the display area 10 on the second inorganic thin film encapsulation layer 453.

As shown in FIG. 8, each of the first sensing electrodes 382 may extend in the first direction D1, and may be spaced apart from each other in the second direction D2. The second sensing electrodes 384 may be spaced apart from each other in the first direction D1 between two adjacent first sensing electrodes 382 among the first sensing electrodes 382.

In the first output area 61, the eighth electrode pattern 383 may be disposed on the seventh electrode pattern 291.

Each of the eighth electrode pattern 383, the first sensing electrodes 382, and the second sensing electrodes 384 may include carbon nanotube (CNT), transparent conductive oxide, indium tin oxide (ITO), indium gallium zinc oxide (IGZO), zinc oxide (ZnO), graphene, silver nanowire (Ag nanowire; AgNW), copper (Cu), chromium (Cr), and the like, or a combination thereof.

Accordingly, the first output pad 710 including the first gate pattern 171, the fourth gate pattern 176, the first electrode pattern 211, the fourth electrode pattern 236, the seventh electrode pattern 291, and the eighth electrode pattern 383 may be provided. In embodiments, the first output pad 710 may have the first height h1 that may be greater than the second height h2.

Although the first output pad 710 has been described as having a stacked structure including the first gate pattern 171, the fourth gate pattern 176, the first electrode pattern 211, the fourth electrode pattern 236, the seventh electrode pattern 291, and the eighth electrode pattern 383, the stacked structure of the first output pad 710 is not limited thereto. For example, the stacked structure of the first output pad 710 may be appropriately modified according to the first height h1 (e.g., a distance from the top surface of the substrate 110 to the bottom surface of the conductive ball 810) that may vary.

The first insulating layer 395 may be disposed in the display area 10 on the first and second sensing electrodes 382 and 384. The first insulating layer 395 may be disposed along a profile of the first and second sensing electrodes 382 and 384 with a uniform thickness to cover the first and second sensing electrodes 382 and 384 in the display area 10. The first insulating layer 395 may include an organic insulating material or an inorganic insulating material. In some embodiments, the first insulating layer 395 may have a multilayer structure including insulating layers. For example, the insulating layers may have mutually different thicknesses, or may include mutually different materials.

The sensing connection electrodes 386 may be disposed in the display area 10 on the first insulating layer 395. As shown in FIG. 8, the sensing connection electrodes 386 may electrically connect two second sensing electrodes 384 adjacent to each other in the second direction D2 among the second sensing electrodes 384 through a contact hole. For example, the sensing connection electrodes 386 may include the same material as the first and second sensing electrodes 382 and 384. In some embodiments, the sensing connection electrodes 386 may include a metal, an alloy, metal nitride, conductive metal oxide, a transparent conductive material, and the like. These may be used alone or in combination with each other.

The second insulating layer 410 may be disposed in the display area 10 on the first insulating layer 395 and the sensing connection electrodes 386. The second insulating layer 410 may be formed of an organic insulating material or an inorganic insulating material. In some embodiments, the second insulating layer 410 may have a multilayer structure including insulating layers. For example, the insulating layers may have mutually different thicknesses, or may include mutually different materials.

Accordingly, the sensing structure 380 including the first sensing electrodes 382, the first insulating layer 395, the sensing connection electrodes 386, and the second insulating layer 410 may be provided.

The conductive film 800 may be disposed on the first output pad 710, the second output pad 720, and the input pad 730. In other words, the conductive film 800 may be interposed between the driving integrated circuit 600 and the substrate 110. A conductive ball 810 may be disposed on each of the first output pad 710, the second output pad 720, and the input pad 730.

The driving integrated circuit 600 may be disposed on the conductive film 800. The upper output bumps 610, the lower output bumps 620, and the input bumps 630 may be disposed on the conductive balls 810.

Accordingly, the conductive film 800 including the conductive balls 810 and the film layer 830 and the driving integrated circuit 600 including the upper output bumps 610, the lower output bumps 620, the input bumps 630, and the circuit part 670 may be provided, and the display device 100 shown in FIGS. 1 to 8 may be provided.

Although the display device 100 according to the disclosure has been described as specifically being an organic light emitting diode display device, the configuration of the disclosure is not limited thereto. In other embodiments, the display device 100 may include a liquid crystal display device (LCD), a field emission display device (FED), a plasma display device (PDP), or an electrophoretic display device (EPD).

FIGS. 9 to 13 are schematic cross-sectional views showing a method of manufacturing a display device according to embodiments of the disclosure.

Referring to FIGS. 1, 6, 7, and 9, the substrate 110 including a transparent or opaque material may be provided. The substrate 110 may be a transparent resin substrate. An example of the transparent resin substrate that may be used as the substrate 110 includes a polyimide substrate. The polyimide substrate may include a first polyimide layer, a barrier film layer, and a second polyimide layer.

The adhesive layer 305 may be formed on the bottom surface of the substrate 110. The adhesive layer 305 may be formed by using OCA, PSA, OCR, and the like, or a combination thereof.

The lower protective film 300 may be formed on the bottom surface of the adhesive layer 305. A Young's modulus of polyimide may be approximately 3,900 MPa at a room temperature (e.g., about 25 degrees), and approximately 2,600 MPa at a high temperature (e.g., about 150 degrees). A Young's modulus of heat-resistant PET may be approximately 4,700 MPa at the room temperature, and approximately 800 MPa at the high temperature.

The semiconductor element 250, the gate insulating layer 150, the first interlayer insulating layer 190, the second interlayer insulating layer 195, the connection electrode 235, the first planarization layer 270, the second planarization layer 275, the pixel defining layer 310, the display structure 200, the thin film encapsulation structure 450, the sensing structure 380, and the like may be formed in the display area 10 on the substrate 110.

The signal pads 470, the first output pad 710, the second output pad 720, and the input pad 730 may be formed in the pad area 60 on the substrate 110. In embodiments, the first output pad 710 may be formed with the first height h1 in the first output area 61, the second output pad 720 may be formed with the second height h2 in the second output area 62, and the input pad 730 may be formed with the second height h2 in the input area 63.

Figure 10:
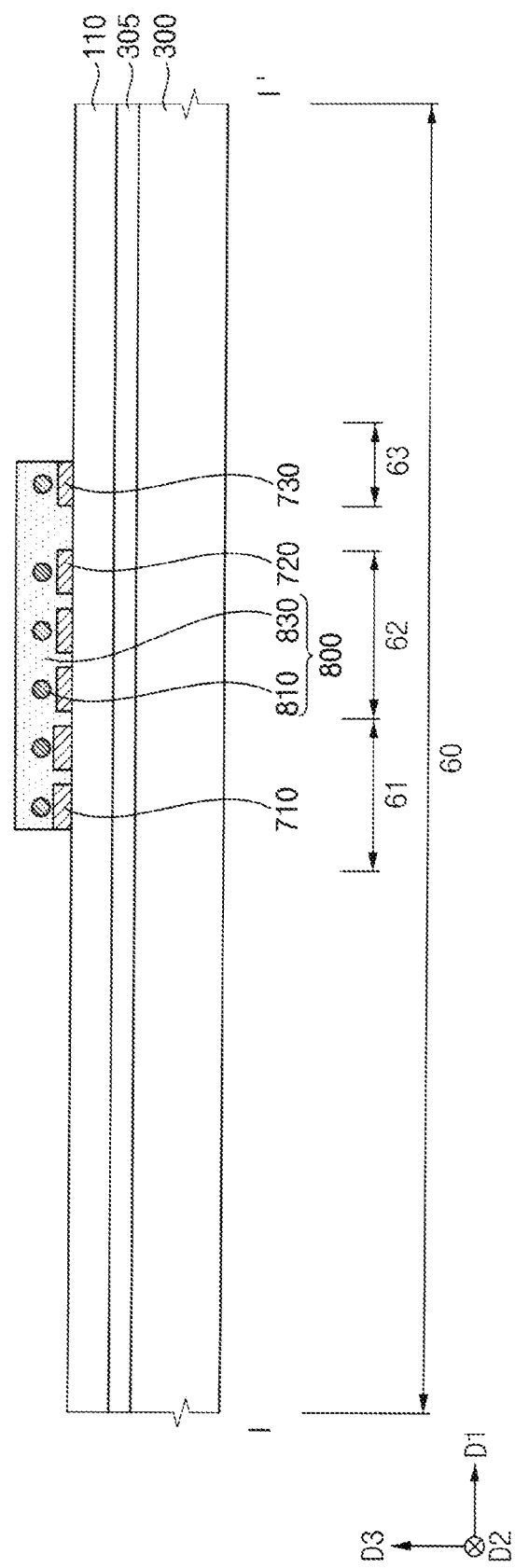

Referring to FIG. 10, the conductive film 800 including conductive balls 810 and a film layer 830 may be formed on the first output pad 710, the second output pad 720, and the input pad 730. For example, the conductive balls 810 may be located inside the film layer 830. The conductive balls 810 may be arranged in the first direction D1 and the second direction D2 inside the film layer 830, and may be spaced apart from each other at equidistant intervals. In other words, the conductive balls 810 may be arranged on a single layer in a lattice shape, and may not overlap each other in the third direction D3. The conductive balls 810 may be located on the upper output bump 610, the lower output bump 620, and the input bump 630, and the film layer 830 may surround the upper output bump 610, the lower output bump 620, the input bump 630, and the conductive balls 810.

Each of the conductive balls 810 may have a structure in which a spherical polymer may be coated with a metal layer such as a nickel layer, a cobalt layer, a gold layer, a silver layer, a copper layer, or a combination thereof. The film layer 830 may be formed by using a thermosetting resin. For example, the film layer 830 may include an epoxy resin, an amino resin, a phenol resin, a urea resin, a melamine resin, an unsaturated polyester resin, a polyurethane resin, a polyimide resin, and the like, or a combination thereof.

Figure 11:
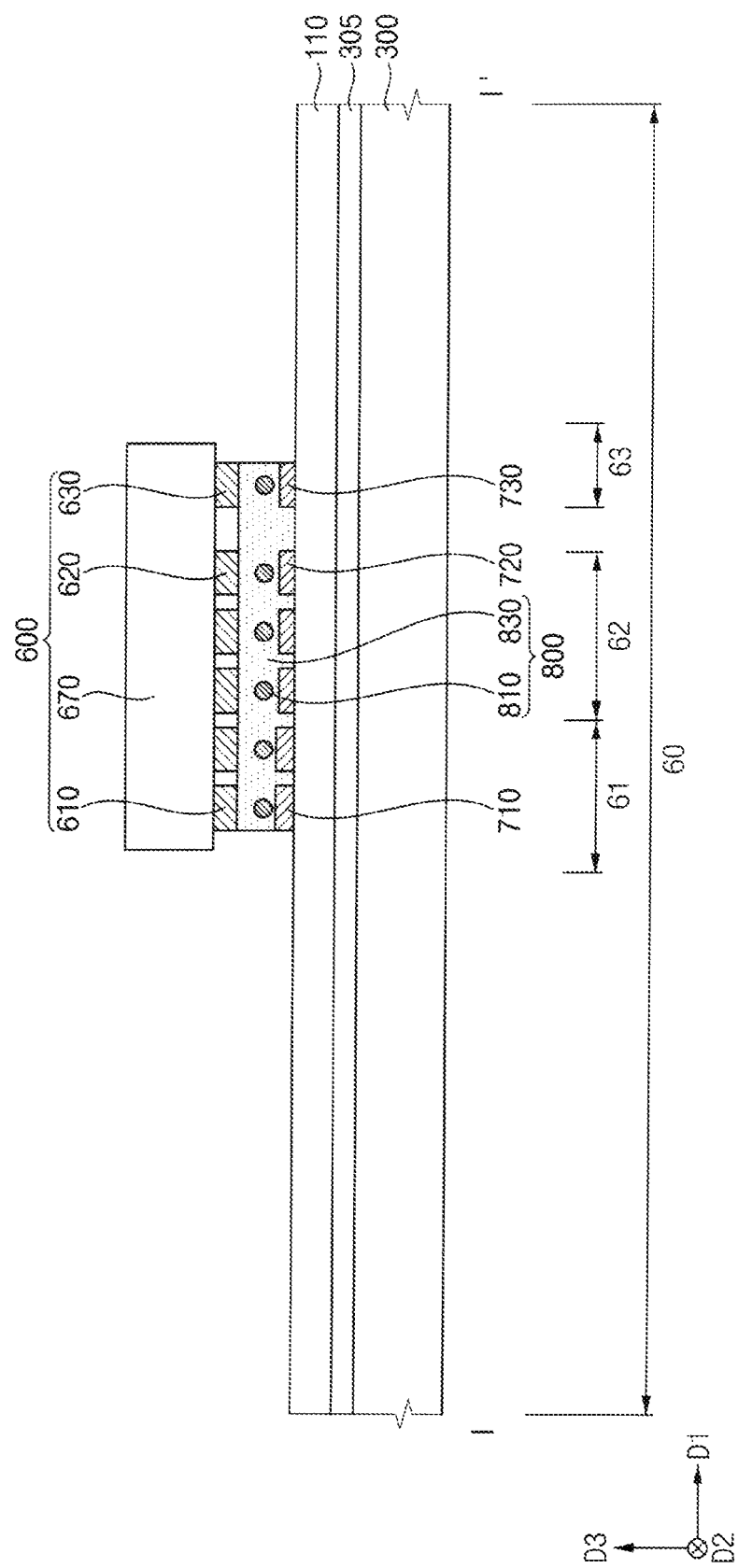

Referring to FIG. 11, the driving integrated circuit 600 including an upper output bump 610, a lower output bump 620, an input bump 630, and a circuit part 670 may be located on the conductive film 800.

The upper output bump 610 may be located in the first output area 61 on the conductive film 800, and may overlap the first output pad 710. The lower output bump 620 may be located in the second output area 62 on the conductive film 800, and may overlap the second output pad 720. The input bump 630 may be located on the input area 63 on the conductive film 800, and may overlap the input pad 730.

Each of the upper output bump 610, the lower output bump 620, the input bump 630, the first output pad 710, the second output pad 720, and the input pad 730 may include a metal, an alloy, metal nitride, conductive metal oxide, a transparent conductive material, and the like, or a combination thereof. For example, each of the upper output bump 610, the lower output bump 620, the input bump 630, the first output pad 710, the second output pad 720, and the input pad 730 may be formed by using Au, Ag, Al, W, Cu, Pt, Ni, Ti, Pd, Mg, Ca, Li, Cr, Ta, Mo Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. These may be used alone or in combination with each other.

Referring to FIG. 12, the heating member 690 may be located on the driving integrated circuit 600, and may make contact with a top surface of the driving integrated circuit 600. The heating member 690 may be heated to a preset temperature, and may apply a pressure (e.g., a force) to the driving integrated circuit 600 in the direction opposite to the third direction D3. An interval between the substrate 110 and the upper output bump 610 and the driving integrated circuit 600 may be reduced due to the pressure.

Referring to FIG. 13, each of the adhesive layer 305 and the lower protective film 300 may have a low (e.g., relatively) Young's modulus, so that the adhesive layer 305 and the lower protective film 300 may flow to a portion that surrounds the portion where the driving integrated circuit 600 may be disposed (e.g., the outer peripheral portion) due to the force. The first and second steps 110a and 110b of the substrate 110 may be formed due to the flow phenomenon of each of the lower protective film 300 and the adhesive layer 305. In other words, the thickness t1 of the lower protective film 300 at the contact portion may be smaller than the thickness t2 of the lower protective film 300 at the outer peripheral portion, and the thickness t3 of the adhesive layer 305 at the contact portion may be smaller than the thickness t4 of the adhesive layer 305 at the outer peripheral portion.

An inclination of the first step 110a with respect to the first direction D1 may be steeper (e.g., relatively) than an inclination of the second step 110b with respect to the first direction D1. For example, one bump row exists in the input area 63 of the driving integrated circuit 600, and five bump rows exist in the first output area 61 and the second output area 62 of the driving integrated circuit 600. The force may be applied more (e.g., relatively) to the driving integrated circuit 600 that overlaps the first output area 61, and the lower protective film 300 and the adhesive layer 305 that overlap the first output area 61 may be pressed more (e.g., relatively), so that the flow phenomenon may occur more (e.g., relatively). Accordingly, the inclination of the first step 110a may be steeper (e.g., relatively) than the inclination of the second step 110b.

Moreover, the Young's modulus of the heat-resistant PET becomes small (e.g., relatively) due to the heat applied by the heating member 690, and the flow phenomenon occurs, so that a groove may be formed in the lower protective film 300 to overlap the contact portion. The first and second steps 110a and 110b of the substrate 110 may be formed by the groove.

In other words, a distance between the first output pad 710 and the upper output bump 610 in the first output area 61 may be greater than a distance between the input pad 730 and the input bump 630 in the input area 63.

In embodiments, the first output pad 710 may have a large (e.g., relatively) height (e.g., the first height h1) corresponding to a difference in the distances. Accordingly, the conductive ball 810 located between the upper output bump 610 and the first output pad 710 may be maintained in a state of making contact with the upper output bump 610 and the first output pad 710. In some embodiments, similar to the shape of the conductive ball 810a located between the input pad 730 and the input bump 630, the conductive ball 810 may have an elliptical shape when viewed in a plan view depending on the force applied by the heating member 690.

Through the above process, the driving integrated circuit 600 may be mounted on the substrate 110. After the driving integrated circuit 600 may be mounted on the substrate 110, the heating member 690 may be spaced apart from the top surface of the driving integrated circuit 600.

Accordingly, the display device 100 shown in FIGS. 1 to 8 may be manufactured.

Figure 14:
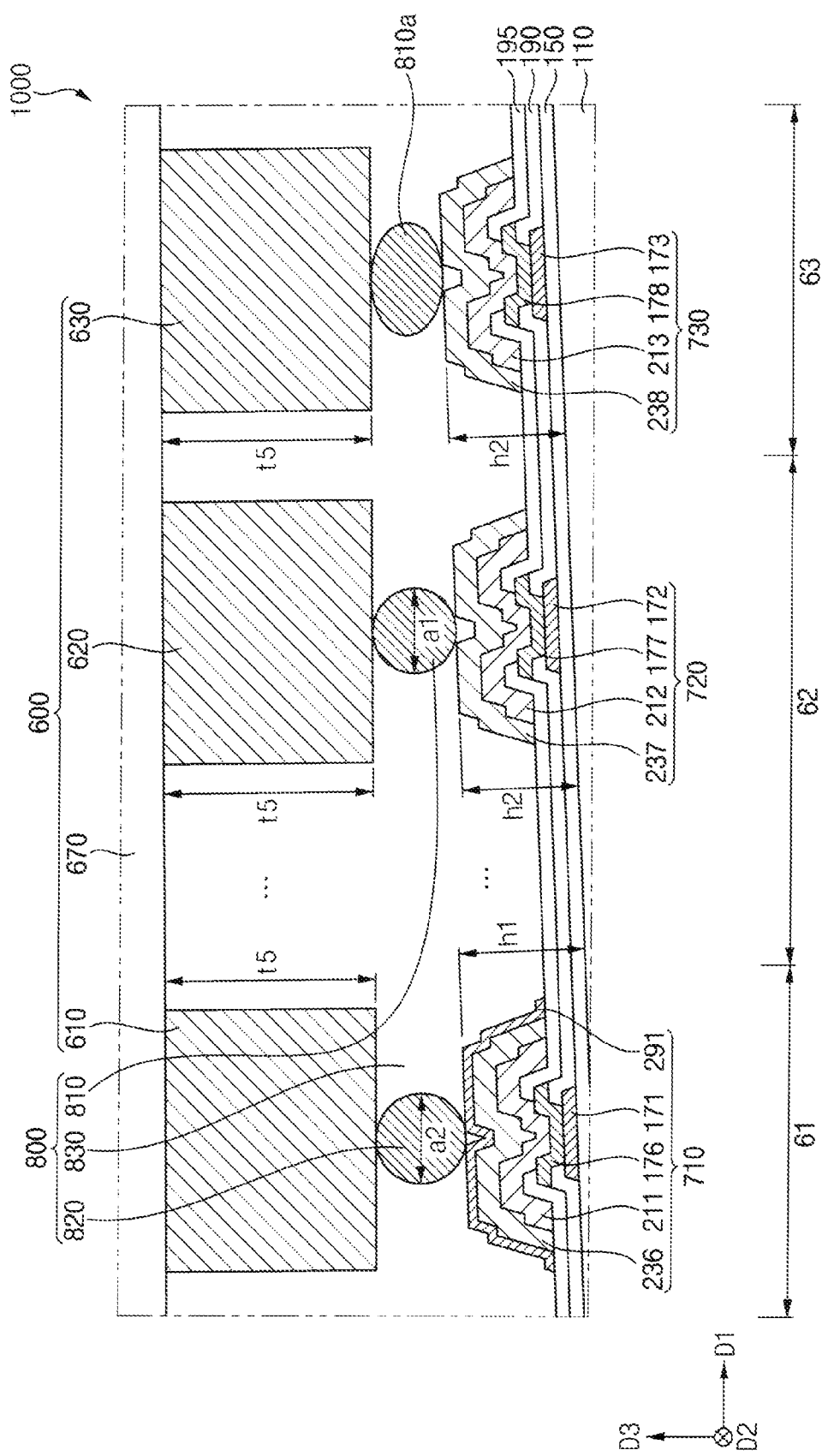
FIG. 14 is a schematic cross-sectional view showing a display device according to embodiments of the disclosure.
Figure 15:
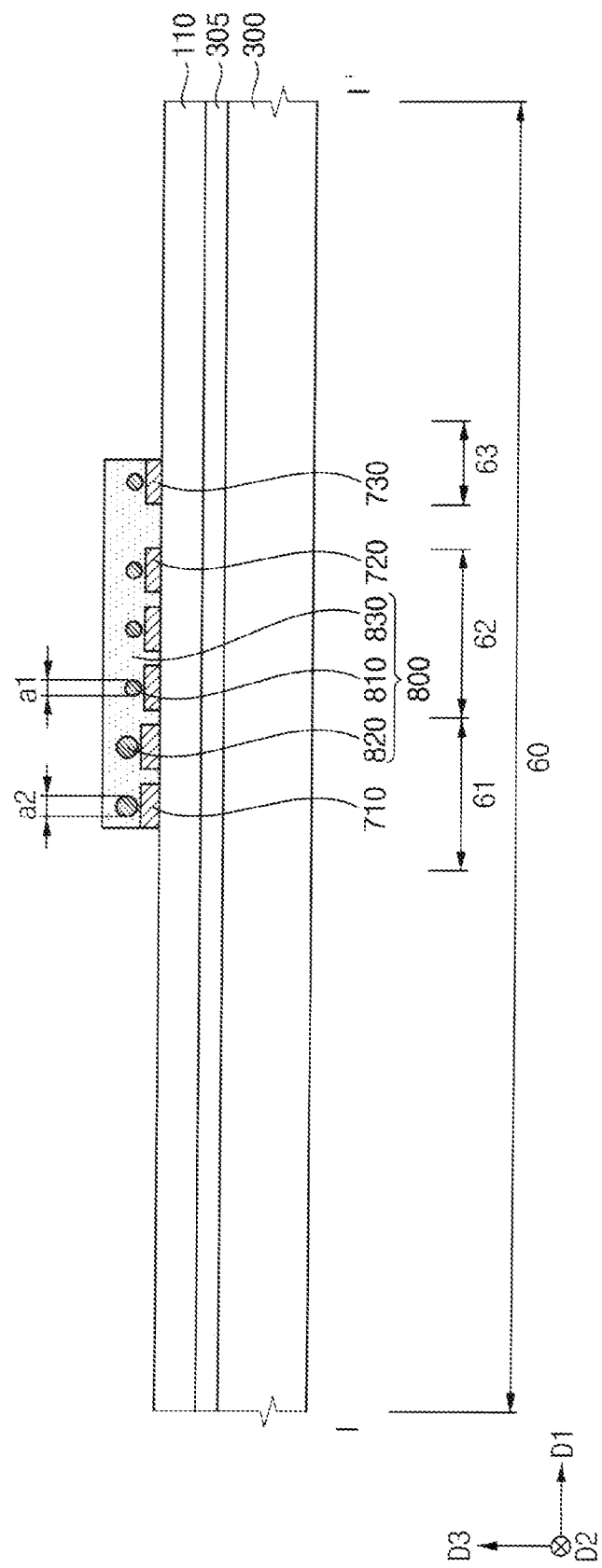
FIG. 15 is a schematic cross-sectional view for describing a conductive ball included in the display device of FIG. 14.

FIG. 14 is a schematic cross-sectional view showing a display device according to embodiments of the disclosure, and FIG. 15 is a schematic cross-sectional view for describing a conductive ball included in the display device of FIG. 14. A display device 1000 shown in FIGS. 14 and 15 may have a configuration that may be substantially identical or similar to the display device 100 described with reference to FIGS. 1 to 8 except for a second conductive ball 820. In FIGS. 14 and 15, redundant descriptions of components that are substantially identical or similar to the components described with reference to FIGS. 1 to 8 will be omitted. For example, FIG. 14 is a partially enlarged cross-sectional view showing 'A' region of FIG. 5, and FIG. 15 may correspond to FIG. 10 among the drawings showing the method of manufacturing the display device.

Referring to FIGS. 14 and 15, the display device 1000 may include a substrate 110, first output pads 710, second output pads 720, input pads 730, a conductive film 800, a driving integrated circuit 600, an adhesive layer 305, a lower protective film 300, and the like. The conductive film 800 may include first conductive balls 810, second conductive balls 820, and a film layer 830. The first output pad 710 may include a first gate pattern 171, a fourth gate pattern 176, a first electrode pattern 211, a fourth electrode pattern 236, and a seventh electrode pattern 291, the second output pad 720 may include a second gate pattern 172, a fifth gate pattern 177, a second electrode pattern 212, and a fifth electrode pattern 237, and the input pad 730 may include a third gate pattern 173, a sixth gate pattern 178, a third electrode pattern 213, and a sixth electrode pattern 238. In embodiments, each of the first conductive balls 810 may have a first diameter a1, and each of the second conductive balls 820 may have a second diameter a2 that may be greater than the first diameter a1. The first conductive balls 810 may be disposed in the second output area 62 or the input area 63, and the second conductive balls 820 may be disposed in the first output area 61.

When compared with the first output pad 710 shown in FIG. 6, the first output pad 710 shown in FIG. 14 may not include an eighth electrode pattern 383. Therefore, the second conductive balls 820, each having the second diameter a2 that may be large (e.g., relatively), may compensate for a thickness of the eighth electrode pattern 383. In other words, the first conductive ball 810 disposed in the second output area 62 may electrically connect the second output pad 720 to the lower output bump 620, the first conductive ball 810 disposed in the input area 63 may electrically connect the input pad 730 to the input bump 630, and the second conductive ball 820 disposed in the first output area 61 may electrically connect the first output pad 710 to the upper output bump 610.

Figure 16:
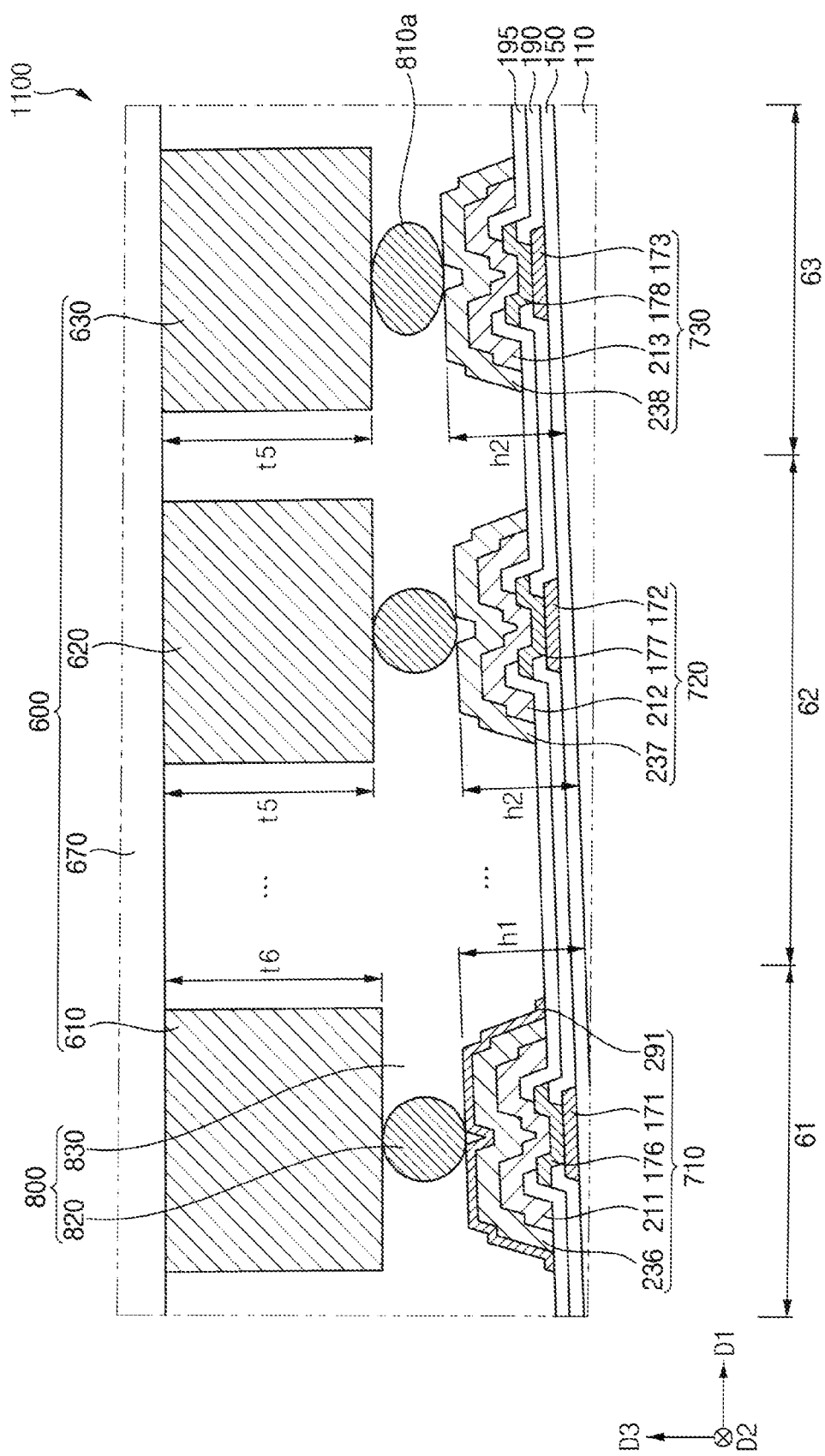
FIG. 16 is a schematic cross-sectional view showing a display device according to embodiments of the disclosure.
Figure 17:
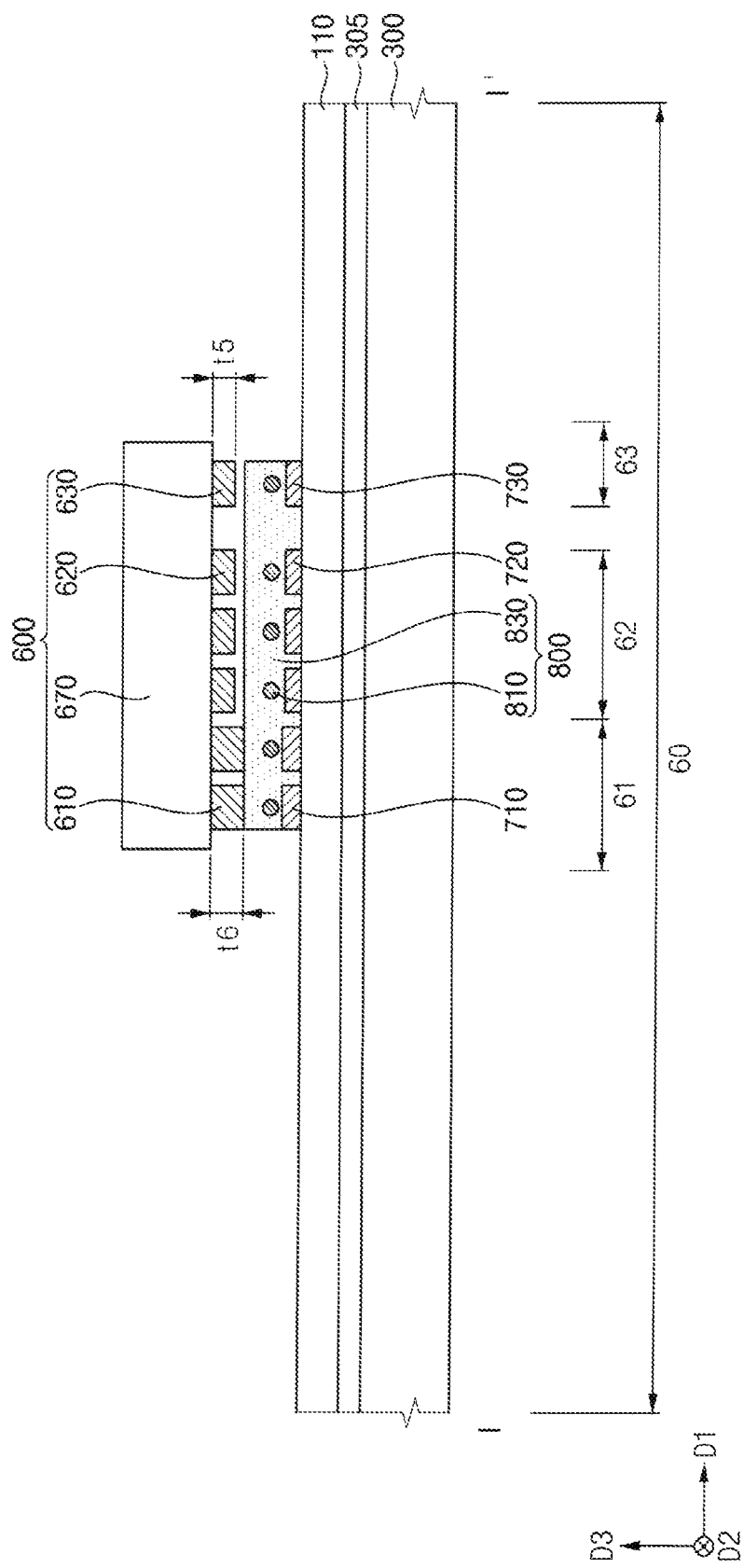
FIG. 17 is a schematic cross-sectional view for describing an upper output bump included in the display device of FIG. 16.

FIG. 16 is a schematic cross-sectional view showing a display device according to embodiments of the disclosure, and FIG. 17 is a schematic cross-sectional view for describing an upper output bump included in the display device of FIG. 16.

A display device 1100 shown in FIGS. 16 and 17 may have a configuration that may be substantially identical or similar to the display device 100 described with reference to FIGS. 1 to 8 except for an upper output bump 610 having a second thickness t6 that may be large (e.g., relatively). In FIGS. 16 and 17, redundant descriptions of components that are substantially identical or similar to the components described with reference to FIGS. 1 to 8 will be omitted. For example, FIG. 16 is a partially enlarged cross-sectional view showing 'A' region of FIG. 5, and FIG. 17 may correspond to FIG. 11 among the drawings showing the method of manufacturing the display device.

Referring to FIGS. 16 and 17, the display device 1100 may include a substrate 110, first output pads 710, second output pads 720, input pads 730, a conductive film 800, a driving integrated circuit 600, an adhesive layer 305, a lower protective film 300, and the like. The driving integrated circuit 600 may include an upper output bump 610, a lower output bump 620, an input bump 630, and a circuit part 670, and the conductive film 800 may include conductive balls 810 and a film layer 830. The first output pad 710 may include a first gate pattern 171, a fourth gate pattern 176, a first electrode pattern 211, a fourth electrode pattern 236, and a seventh electrode pattern 291, the second output pad 720 may include a second gate pattern 172, a fifth gate pattern 177, a second electrode pattern 212, and a fifth electrode pattern 237, and the input pad 730 may include a third gate pattern 173, a sixth gate pattern 178, a third electrode pattern 213, and a sixth electrode pattern 238. In embodiments, each of the lower output bump 620 and the input bump 630 may have a first thickness t5, and the upper output bump 610 may have a second thickness t6 that may be greater than the first thickness t5. The upper output bump 610 may be located in the first output area 61, the lower output bump 620 may be located in the second output area 62, and the input bump 630 may be located in the input area 63.

When compared with the first output pad 710 shown in FIG. 6, the first output pad 710 shown in FIG. 16 may not include an eighth electrode pattern 383. Therefore, the upper output bump 610 having the second thickness t6 that may be large (e.g., relatively) may compensate for a thickness of the eighth electrode pattern 383.

The disclosure may be applied to various electronic devices including a display device. For example, the disclosure may be applied to numerous electronic devices such as vehicle-display devices, ship-display devices, aircraft-display devices, portable communication devices, display devices for display or for information transfer, medical-display devices, etc.

The foregoing is illustrative of embodiments and is not to be construed as limiting. Although a few embodiments have been described, those skilled in the art will readily appreciate that many modifications are possible in the embodiments without materially departing from the novel teachings and features of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the disclosure.

What is claimed is:

1. A display device comprising:
   a substrate including a display area and a pad area;
   a display structure disposed in the display area on the substrate;
   a driving integrated circuit disposed in the pad area on the substrate, and including:
      a circuit part including an input area, a first output area adjacent to the display area, and a second output area between the input area and the first output area;
      upper output bumps disposed in the first output area on a bottom surface of the circuit part; and
      lower output bumps disposed in the second output area on the bottom surface of the circuit part;
   first output pads disposed between the substrate and the upper output bumps, and having a first height; and
   second output pads disposed between the substrate and the lower output bumps, and having a second height that is smaller than the first height, wherein
   the circuit part consists of a single body upon which are attached both the upper output bumps and the lower output bumps.

2. The display device of claim 1, further comprising a conductive film disposed between the driving integrated circuit and the substrate.

3. The display device of claim 2, wherein the conductive film includes:
   a film layer;
   first conductive balls disposed inside the film layer, overlapping the second output area, and having a first diameter; and
   second conductive balls disposed inside the film layer, overlapping the first output area, and having a second diameter that is greater than the first diameter.

4. The display device of claim 3, wherein
   at least one of the first conductive balls electrically connects at least one of the first output pads to at least one of the upper output bumps, the at least one of the upper output bumps overlapping the at least one of the first output pads, and
   at least one of the second conductive balls electrically connects at least one of the second output pads to at least one of the lower output bumps, the at least one of the lower output bumps overlapping the at least one of the second output pads.

5. The display device of claim 1, further comprising:
   a lower protective film disposed on a bottom surface of the substrate; and an adhesive layer disposed between the substrate and the lower protective film.

6. The display device of claim 5, wherein
each of the lower protective film and the adhesive layer includes:
a first portion where the driving integrated circuit is not disposed; and
a second portion where the driving integrated circuit is disposed, and
a thickness of the first portion is greater than a thickness of the second portion.

7. The display device of claim 1, wherein, in a plan view of the display device, a width of the first output area and the second output area in a first direction is greater than a width of the input area in the first direction.

8. The display device of claim 1, further comprising signal pads disposed in the pad area on the substrate, and spaced apart from the driving integrated circuit in a first direction,
wherein the signal pads are arranged in a second direction and spaced apart from each other, the first direction and the second direction being orthogonal to each other.

9. The display device of claim 1, wherein a thickness of the upper output bumps is greater than a thickness of the lower output bumps.

10. The display device of claim 1, wherein
the substrate further includes a bending area disposed between the display area and the pad area, and
the first output area of the circuit part is disposed closer to the bending area than the second output area of the circuit part.

11. The display device of claim 1, wherein
the first height is defined as a distance from a top surface of the substrate to an uppermost surface of each of the first output pads, and
the second height is defined as a distance from the top surface of the substrate to an uppermost surface of each of the second output pads.

12. The display device of claim 1, wherein the display structure includes:
a lower electrode;
a light emitting layer disposed on the lower electrode; and
an upper electrode disposed on the light emitting layer.

13. The display device of claim 1, wherein the input area, the first output area, and the second output area are directly over the substrate.

14. A display device comprising:
a substrate including a display area and a pad area;
a display structure disposed in the display area on the substrate;
a driving integrated circuit disposed in the pad area on the substrate, and including:
a circuit part including an input area, a first output area adjacent to the display area, and a second output area between the input area and the first output area;
upper output bumps disposed in the first output area on a bottom surface of the circuit part; and
lower output bumps disposed in the second output area on the bottom surface of the circuit part;
first output pads disposed between the substrate and the upper output bumps, and having a first height; and
second output pads disposed between the substrate and the lower output bumps, and having a second height that is smaller than the first height, wherein
the driving integrated circuit further includes input bumps disposed in the input area on the bottom surface of the circuit part.

15. The display device of claim 14, wherein
the input area is spaced apart from the second output area in a first direction, and
the input bumps are arranged in a second direction and spaced apart from each other, the first direction and the second direction being orthogonal to each other.

16. The display device of claim 15, wherein, in a plan view of the display device, an area of each of the upper output bumps and the lower output bumps is smaller than an area of each of the input bumps.

17. The display device of claim 14, wherein the input bumps include:
a reference input bump extending in a first direction;
a first input bump spaced apart from a first side of the reference input bump, and inclined at a first angle with respect to the first direction; and
a second input bump spaced apart from a second side of the reference input bump, and symmetrical to the first input bump with respect to the reference input bump.

18. The display device of claim 14, further comprising input pads disposed between the substrate and the input bump, and having the second height.

19. A display device comprising:
a substrate including a display area and a pad area;
a display structure disposed in the display area on the substrate;
a driving integrated circuit disposed in the pad area on the substrate, and including:
a circuit part including an input area, a first output area adjacent to the display area, and a second output area between the input area and the first output area;
upper output bumps disposed in the first output area on a bottom surface of the circuit part; and
lower output bumps disposed in the second output area on the bottom surface of the circuit part;
first output pads disposed between the substrate and the upper output bumps, and having a first height; and
second output pads disposed between the substrate and the lower output bumps, and having a second height that is smaller than the first height, wherein
the upper output bumps include:
a reference upper output bump extending in a first direction;
a first upper output bump spaced apart from a first side of the reference upper output bump, and inclined at a first angle with respect to the first direction; and
a second upper output bump spaced apart from a second side of the reference upper output bump, and symmetrical to the first upper output bump with respect to the reference upper output bump.

20. The display device of claim 19, wherein the lower output bumps include:
a reference lower output bump spaced apart from the reference upper output bump in the first direction, and extending in the first direction;
a first lower output bump spaced apart from the first upper output bump in the first direction, and inclined at the first angle; and
a second lower output bump spaced apart from the second upper output bump in the first direction, and symmetrical to the first lower output bump with respect to the reference lower output bump.

21. The display device of claim 20, wherein
the reference upper output bump, the first upper output bump, and the second upper output bump are arranged in a second direction that is orthogonal to the first direction, and the reference lower output bump, the first lower output bump, and the second lower output bump are arranged in the second direction.

\* \* \* \* \*